(12) United States Patent
Leem et al.

(10) Patent No.: US 12,178,056 B2
(45) Date of Patent: Dec. 24, 2024

(54) SENSOR AND ELECTRONIC DEVICE

(71) Applicant: Samsung Electronics Co., Ltd., Suwon-si (KR)

(72) Inventors: Dong-Seok Leem, Seongnam-si (KR); Rae Sung Kim, Hwaseong-si (KR); Ohkyu Kwon, Seoul (KR); Changki Kim, Suwon-si (KR); Insun Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 462 days.

(21) Appl. No.: 17/509,451

(22) Filed: Oct. 25, 2021

(65) Prior Publication Data
US 2022/0131098 A1    Apr. 28, 2022

(30) Foreign Application Priority Data

Oct. 28, 2020 (KR) .......... 10-2020-0141347
Oct. 22, 2021 (KR) .......... 10-2021-0141666

(51) Int. Cl.
*H10K 30/10*    (2023.01)
*H10K 30/20*    (2023.01)
(Continued)

(52) U.S. Cl.
CPC ............ *H10K 30/10* (2023.02); *H10K 30/81* (2023.02); *H10K 85/624* (2023.02);
(Continued)

(58) Field of Classification Search
CPC ....... H10K 50/11; H10K 85/624–6572; H10K 30/00; H10K 85/211; H10K 85/311; H10K 2101/40; Y02E 10/549
See application file for complete search history.

(56) References Cited

U.S. PATENT DOCUMENTS 8,796,699 B2    8/2014    So et al.
9,006,752 B2    4/2015    So et al.
(Continued)

FOREIGN PATENT DOCUMENTS

CN      107331776 B    12/2019
JP        6010514 B2    10/2016
(Continued)

OTHER PUBLICATIONS

Zafar, 2015, "PRO-DBT:MEH-PPV:PC71BM Ternary Blend Assisted Platform as a Photodetector" (Year: 2015).*
(Continued)

*Primary Examiner* — Syed I Gheyas
*Assistant Examiner* — Casey Paul Boatman
(74) *Attorney, Agent, or Firm* — Harness, Dickey & Pierce, P.L.C.

(57) ABSTRACT

A sensor includes first and second electrodes, and an infrared photoelectric conversion layer between the first and second electrodes, the infrared photoelectric conversion layer being configured to absorb light in at least a portion of an infrared wavelength spectrum and convert the absorbed light to an electrical signal. The infrared photoelectric conversion layer includes a first material having a maximum absorption wavelength in an infrared wavelength spectrum, a second material forming a pn junction with the first material, and a third material having an energy band gap greater than the energy band gap of the first material by greater than or equal to about 1.0 eV. The first material, the second material, and the third material are different from each other, and each of the first material, the second material, and the third material is a non-polymeric material.

20 Claims, 13 Drawing Sheets

(51) Int. Cl.
*H10K 30/81* (2023.01)
*H10K 50/11* (2023.01)
*H10K 85/60* (2023.01)
*H10K 101/30* (2023.01)
*H10K 101/40* (2023.01)

(52) U.S. Cl.
CPC ......... *H10K 85/6572* (2023.02); *H10K 30/20* (2023.02); *H10K 50/11* (2023.02); *H10K 2101/30* (2023.02); *H10K 2101/40* (2023.02)

(56) References Cited

U.S. PATENT DOCUMENTS

| | | | |
|---|---|---|---|
| 9,287,328 B2 | 3/2016 | Suzuki | |
| 10,998,514 B2 | 5/2021 | Park et al. | |
| 2007/0181179 A1* | 8/2007 | Brabec | H10K 30/151 136/263 |
| 2011/0049367 A1 | 3/2011 | Forrest et al. | |
| 2017/0077429 A1* | 3/2017 | Huang | H10K 30/353 |
| 2019/0214591 A1* | 7/2019 | Park | H10K 39/32 |
| 2019/0363269 A1 | 11/2019 | Leem et al. | |
| 2020/0212329 A1 | 7/2020 | Suganuma et al. | |
| 2021/0083199 A1* | 3/2021 | Choi | H10K 85/657 |
| 2021/0135136 A1* | 5/2021 | Shin | H10K 85/654 |
| 2021/0257571 A1 | 8/2021 | Ferrara et al. | |

FOREIGN PATENT DOCUMENTS

| | | |
|---|---|---|
| JP | 6025243 B2 | 11/2016 |
| JP | 2020-057686 A | 4/2020 |
| KR | 10-1703311 B1 | 2/2017 |
| KR | 10-1815072 B1 | 1/2018 |
| KR | 2019-0065171 A | 6/2019 |
| KR | 2019-0135216 A | 12/2019 |
| KR | 2020-0081276 A | 7/2020 |
| WO | WO-2016-148184 A1 | 9/2016 |
| WO | WO-2020/130133 A1 | 6/2020 |

OTHER PUBLICATIONS

Extended European Search Report dated Mar. 16, 2022 for corresponding European Application No. 21204420.0.

* cited by examiner

SENSOR AND ELECTRONIC DEVICE

CROSS-REFERENCE TO RELATED APPLICATIONS

This application claims priority to and the benefit of Korean Patent Applications Nos. 10-2020-0141347 and 10-2021-0141666 filed in the Korean Intellectual Property Office on Oct. 28, 2020 and Oct. 22, 2021, respectively, the entire contents of each of which are incorporated herein by reference.

BACKGROUND

1. Field

Sensors and electronic devices are disclosed.

2. Description of the Related Art

An imaging device is used in a digital camera and a camcorder or the like to take (e.g., capture, generate, etc.) an image and to store the same as an electrical signal, and the imaging device includes a sensor separating incident light according to a wavelength and converting each component to an electrical signal.

SUMMARY

Some example embodiments provide a sensor that exhibits improved electrical properties. The sensor may include an infrared sensor that has improved sensitivity in a low illumination environment and/or may be suitable for use as a biometric or authentication device.

Some example embodiments provide an electronic device including the sensor.

According to some example embodiments, a sensor includes a first electrode and a second electrode, and an infrared photoelectric conversion layer between the first electrode and the second electrode. The infrared photoelectric conversion layer may be configured to absorb light in at least a portion of an infrared wavelength spectrum and convert the absorbed light into an electrical signal. The infrared photoelectric conversion layer may include a first material having a maximum absorption wavelength in the infrared wavelength spectrum, a second material forming a pn junction with the first material, and a third material having an energy band gap greater than the energy band gap of the first material by greater than or equal to about 1.0 eV. The first material, the second material, and the third material may be different from each other. Each of the first material, the second material, and the third material may be a non-polymeric material.

A difference between a HOMO energy level of the first material and a HOMO energy level of the third material may be less than about 1.0 eV.

A difference between a HOMO energy level of the second material and a HOMO energy level of the first material may be greater than or equal to about 0.5 eV.

The energy band gap of the first material may be about 0.5 eV to about 1.8 eV, and the energy band gap of the third material may be about 2.8 eV to about 4.0 eV.

The energy band gap of the third material may be greater than an energy band gap of the second material.

The first material may be included in the infrared photoelectric conversion layer in a smaller amount than the second material.

A composition ratio of the first material to the second material in the infrared photoelectric conversion layer may be about 0.10:1 to about 0.90:1.

A composition ratio of the first material to the second material in the infrared photoelectric conversion layer may be about 0.10:1 to about 0.50:1.

Each of the first material and the third material may be included in the infrared photoelectric conversion layer in a smaller amount than the second material.

The third material may be included in the infrared photoelectric conversion layer in an amount of about 1 volume % to about 40 volume % based on a total volume of the infrared photoelectric conversion layer.

The third material may be included in the infrared photoelectric conversion layer in an amount of about 7 volume % to about 25 volume % based on a total volume of the infrared photoelectric conversion layer.

A maximum absorption wavelength of the infrared photoelectric conversion layer may be longer than the maximum absorption wavelength of the first material.

A maximum absorption wavelength of a maximum external quantum efficiency wavelength of the sensor may be shifted toward a longer wavelength as a content of the third material in the infrared photoelectric conversion layer increases.

The third material may be an organic material.

The third material may be represented by Chemical Formula 1.

[Chemical Formula 1]

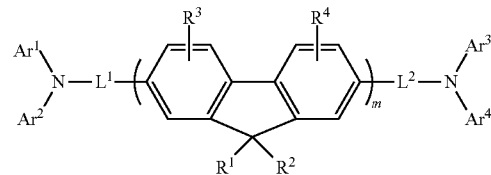

In Chemical Formula 1,

L$^1$ and L$^2$ may independently be a single bond, a substituted or unsubstituted C1 to C30 alkylene group, a substituted or unsubstituted C6 to C30 arylene group, or a combination thereof, Ar$^1$ to Ar$^4$ may independently be a substituted or unsubstituted C6 to C30 aryl group, Ar$^1$ and Ar$^2$ may independently be present or be combined to each other to form a ring, Ar$^3$ and Ar$^4$ may independently be present or be combined to each other to form a ring, R$^1$ to R$^4$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a halogen, a cyano group, or a combination thereof, R$^1$ to R$^4$ may independently be present or two of R$^1$ to R$^4$ that are adjacent to each other may be combined to form a ring, and m is an integer of 0 to 2.

The third material may be represented by one of Chemical Formulas 1-1 to 1-8.

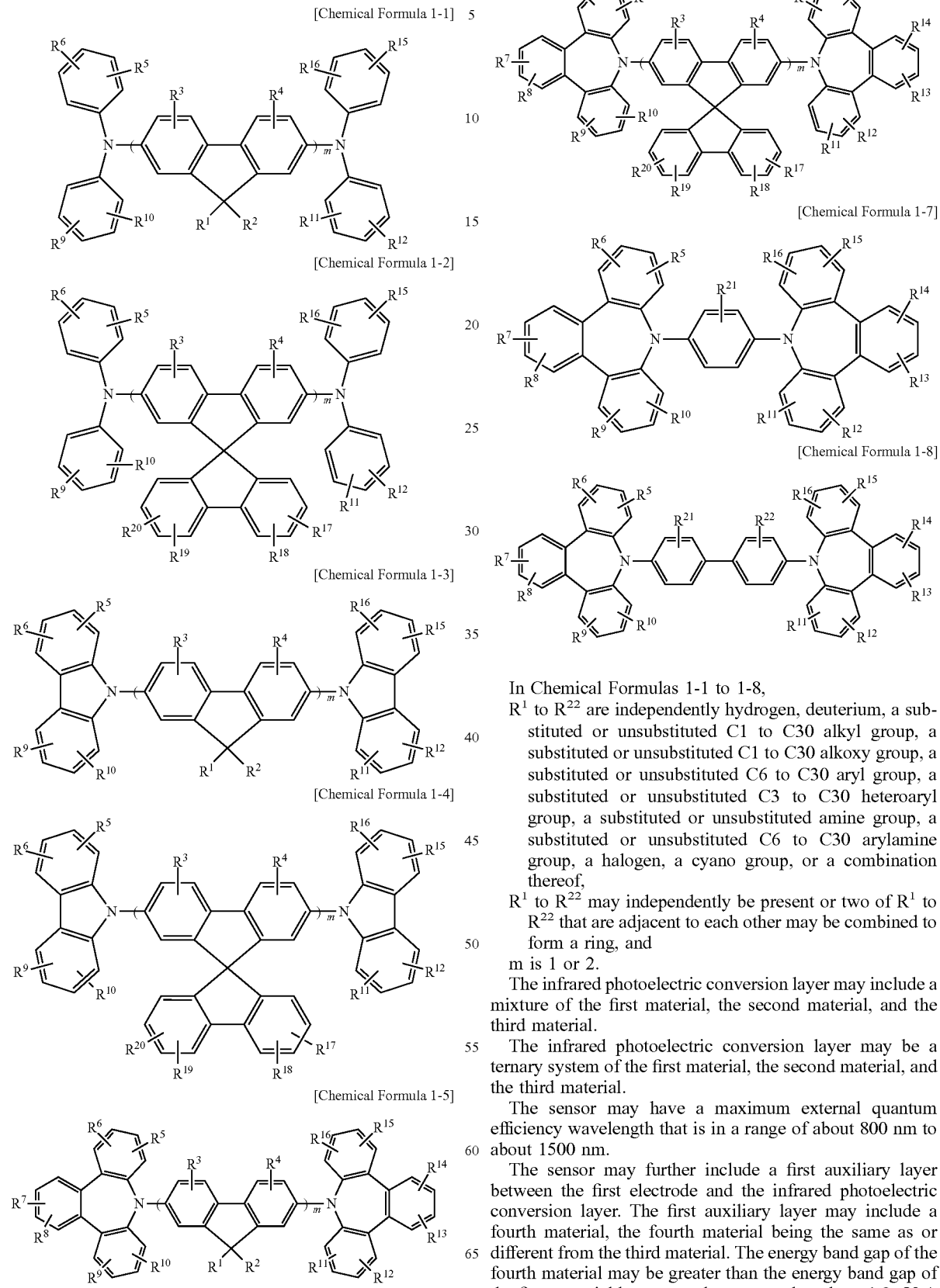

In Chemical Formulas 1-1 to 1-8,
$R^1$ to $R^{22}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a halogen, a cyano group, or a combination thereof,
$R^1$ to $R^{22}$ may independently be present or two of $R^1$ to $R^{22}$ that are adjacent to each other may be combined to form a ring, and
m is 1 or 2.

The infrared photoelectric conversion layer may include a mixture of the first material, the second material, and the third material.

The infrared photoelectric conversion layer may be a ternary system of the first material, the second material, and the third material.

The sensor may have a maximum external quantum efficiency wavelength that is in a range of about 800 nm to about 1500 nm.

The sensor may further include a first auxiliary layer between the first electrode and the infrared photoelectric conversion layer. The first auxiliary layer may include a fourth material, the fourth material being the same as or different from the third material. The energy band gap of the fourth material may be greater than the energy band gap of the first material by greater than or equal to about 1.0 eV. A HOMO energy level of the fourth material may be between a work function of the first electrode and a HOMO energy level of the first material.

According to some example embodiments, a sensor may include a first electrode and a second electrode, and an infrared photoelectric conversion layer between the first electrode and the second electrode. The infrared photoelectric conversion layer may include a mixture of a first material having a maximum absorption wavelength in an infrared wavelength spectrum, a second material forming a pn junction with the first material, and a third material represented by Chemical Formula 1. A maximum absorption wavelength of the infrared photoelectric conversion layer may be longer than the maximum absorption wavelength of the first material.

The maximum absorption wavelength of the infrared photoelectric conversion layer may be longer than the maximum absorption wavelength of the first material by greater than or equal to about 30 nm.

A maximum absorption wavelength or a maximum external quantum efficiency wavelength of the sensor may be shifted toward a longer wavelength as a content of the third material in the infrared photoelectric conversion layer increases.

The third material may be included in the infrared photoelectric conversion layer in an amount of about 1 volume % to about 40 volume % based on a total volume of the infrared photoelectric conversion layer.

The third material may be included in the infrared photoelectric conversion layer in an amount of about 7 volume % to about 25 volume % based on a total volume of the infrared photoelectric conversion layer.

The maximum absorption wavelength of the first material may belong to about 750 nm to about 1200 nm, and the maximum absorption wavelength of the infrared photoelectric conversion layer may belong to about 1000 nm to about 1500 nm.

The third material may be represented by one of Chemical Formulas 1-1 to 1-8.

The first material may include a metal phthalocyanine complex or a metal naphthalocyanine complex.

According to some example embodiments, an electronic device including the sensor is provided.

According to some example embodiments, a composition for an infrared sensor may include a first material having a maximum absorption wavelength in an infrared wavelength spectrum, a second material forming a pn junction with the first material, and a third material having an energy band gap that is greater than both an energy band gap of the first material and an energy band gap of the second material. A maximum absorption wavelength of the composition may be a longer wavelength than the maximum absorption wavelength of the first material.

The energy band gap of the first material may be in a range of about 0.5 eV to about 1.8 eV. The energy band gap of the second material may be in a range of about 0.8 eV to about 2.4 eV. The energy band gap of the third material may be in a range of about 2.8 eV to about 4.0 eV.

A HOMO energy level of the first material may be in a range of about 4.5 eV to about 5.5 eV. A HOMO energy level of the second material may be in a range of about 5.6 eV to about 7.0 eV. A composition ratio of the first material relative to the second material in the composition may be about 0.10:1 to about 0.90:1.

The third material may be included in the composition in an amount of about 1 volume % to about 40 volume % based on a total volume of the composition.

The first material may include a metal phthalocyanine complex or a metal naphthalocyanine complex.

The second material may include fullerene or a fullerene derivative.

The third material may be represented by Chemical Formula 1.

A sensor may include a first electrode and a second electrode, and an infrared photoelectric conversion layer between the first electrode and the second electrode. The infrared photoelectric conversion layer may include the composition. The infrared photoelectric conversion layer may be configured to absorb light in at least a portion of the infrared wavelength spectrum and convert the absorbed light into an electrical signal.

Under a reverse bias voltage, the dark current of the sensor may be reduced and optical characteristics may be improved based on the infrared photoelectric conversion layer including the third material in combination with the first and second materials.

DETAILED DESCRIPTION

Figure 1:
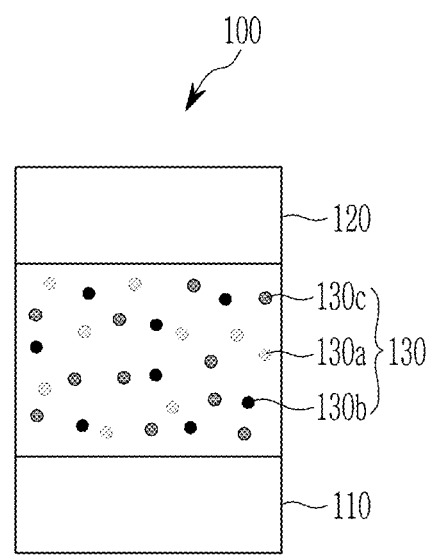
FIG. 1 is a cross-sectional view showing an example of an infrared sensor according to some example embodiments.

Hereinafter, example embodiments are described in detail so that those of ordinary skill in the art can easily implement them. However, some example embodiments may be implemented in various different forms, and is not limited to the example embodiments described herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," or the like, respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, as used herein, when a definition is not otherwise provided, "substituted" refers to replacement of hydrogen of a compound or a group by a substituent selected from a halogen, a hydroxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C30 thioalkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 4 heteroatoms selected from N, O, S, Se, Te, Si, and P.

Hereinafter, as used herein, when a definition is not otherwise provided, "aryl group" refers to a group including at least one aromatic hydrocarbon moiety. All ring-forming atoms of the aromatic hydrocarbon moiety have p-orbitals which form conjugation, for example a phenyl group, a naphthyl group, and the like; two or more aromatic hydrocarbon moieties may be linked by a sigma bond, for example a biphenyl group, a terphenyl group, a quarterphenyl group, and the like; and two or more aromatic hydrocarbon moieties may be fused directly or indirectly to provide a non-aromatic fused ring, for example a fluorenyl group. The aryl group may include a monocyclic, polycyclic or fused ring polycyclic (i.e., rings sharing adjacent pairs of carbon atoms) functional group.

Hereinafter, as used herein, when a definition is not otherwise provided, "heterocycle" or "heterocyclic group" is a generic concept of a heteroaryl group, and may be a ring including at least one heteroatom selected from N, O, S, Se, Te, P, and Si instead of carbon (C) in the ring. When the heterocycle or heterocyclic group is a fused ring, the entire ring or each ring of the heterocyclic group may include one or more heteroatoms.

Hereinafter, a work function, a HOMO energy level, or a LUMO energy level is expressed as an absolute value from a vacuum level. In addition, when the work function, HOMO energy level, or LUMO energy level is referred to be deep, high, or large, it may have a large absolute value based on "0 eV" of the vacuum level, while when the work function, HOMO energy level, or LUMO energy level is referred to be shallow, low, or small, it may have a small absolute value based on "0 eV" of the vacuum level.

Hereinafter, the HOMO energy level is obtained by measuring a film formed of the material at room temperature using a photoelectron spectroscopy device (RIKEN KEIKI Co. Ltd., AC-3). In addition, after measuring the light absorption of the film using an ultraviolet-visible spectrophotometer (UPS), the energy band gap is extracted, and a value obtained by subtracting the previously measured HOMO energy level from the energy band gap is defined as the LUMO energy level.

Hereinafter, an energy band gap refers to an absolute value of a difference between the HOMO energy level and LUMO energy level, the wide or large energy band gap means that an absolute value of the difference between the HOMO energy level and LUMO energy level is large.

Hereinafter, the wavelength at the point where the light absorption is maximum in the optical absorption spectrum is referred to as "maximum absorption wavelength," and the wavelength at the point where the external quantum efficiency (EQE) is maximum in the external quantum efficiency spectrum (EQE spectrum) is referred to as "maximum external quantum efficiency wavelength" or "maximum EQE wavelength."

Under the same conditions, the maximum external quantum efficiency wavelength or the maximum EQE wavelength may be the same as the maximum absorption wavelength, and the term "the maximum external quantum efficiency wavelength" (or "the maximum EQE wavelength") and "the maximum absorption wavelength" may be used interchangeably.

Hereinafter, the "non-polymeric material" may be an organic material having no repeating units, and may be, for example, an organic material having a molecular weight of less than or equal to about 3000 g/mol, less than or equal to about 2500 g/mol, less than or equal to about 2000 g/mol, or less than or equal to about 1500 g/mol. The "non-polymeric material" may be a low molecular weight compound having a molecular weight within the above range.

Hereinafter, "combination" includes a mixture or two or more stacked structures.

Hereinafter, a sensor according to some example embodiments is described.

A sensor according to some example embodiments includes a sensor (hereinafter referred to as an "infrared sensor") configured to sense light in at least a portion of the infrared wavelength spectrum. The infrared sensor may be, for example, a sensor configured to sense light in at least a portion of a near infrared wavelength spectrum, a short wave infrared wavelength spectrum, a mid-wave infrared wavelength spectrum, and a long-wave infrared wavelength spectrum. For example, the infrared sensor may be a sensor configured to sense light in at least a portion of a near infrared wavelength spectrum to a short wave infrared wavelength spectrum. The infrared wavelength spectrum may, for example, belong to greater than about 700 nm and less than or equal to about 3000 nm, and within this range, it may, for example, belong to about 750 nm to about 3000 nm, about 750 nm to about 2500 nm, about 750 nm to about 2300 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, about 750 nm to about 1000 nm, about 800 nm to about 3000 nm, about 800 nm to about 2500 nm, about 800 nm to about 2300 nm, about 800 nm to about 2000 nm, about 800 nm to about 1800 nm, about 800 nm to about 1500 nm, about 800 nm to about 1300 nm, about 800 nm to about 1200 nm, about 800 nm to about 1100 nm, about 800 nm to about 1000 nm, about 850 nm to about 3000 nm, about 850 nm to about 2500 nm, about 850 nm to about 2300 nm, about 850 nm to about 2000 nm, about 850 nm to about 1800 nm, about 850 nm to about 1500 nm, about 850 nm to about 1300 nm, about 850 nm to about 1200 nm, about 850 nm to about 1100 nm, or about 850 nm to about 1000 nm.

The absorption spectrum of the infrared sensor may have a maximum absorption wavelength in the wavelength spectrum.

The infrared sensor may be configured to selectively absorb light in the wavelength spectrum and convert the absorbed light into an electrical signal. The external quantum efficiency (EQE) spectrum of the infrared sensor may have a maximum EQE wavelength in the wavelength spectrum.

Each infrared sensor may independently include a photosensing device such as a photodiode or a photoelectric conversion device.

FIG. 1 is a cross-sectional view illustrating an example of an infrared sensor according to some example embodiments.

Referring to FIG. 1, an infrared light sensor 100 according to some example embodiments includes a first electrode 110 and a second electrode 120 facing each other, and an infrared photoelectric conversion layer 130 between the first electrode 110 and the second electrode 120. An infrared sensor as described herein may be referred to as, or may be included in, a sensor.

The substrate (not shown) may be disposed under the first electrode 110 or may be disposed on the second electrode 120 and may be in direct contact with at least one of the first electrode 110 or the second electrode 120. The substrate may be, for example, made of an inorganic material such as glass, an organic material such as polycarbonate, polymethyl methacrylate, polyethylene terephthalate, polyethylene naphthalate, polyamide, polyethersulfone, or a combination thereof, or a silicon wafer. The substrate may be omitted.

One of the first electrode 110 or the second electrode 120 is an anode and the other is a cathode. For example, the first electrode 110 may be an anode, and the second electrode 120 may be a cathode. For example, the first electrode 110 may be a cathode, and the second electrode 120 may be an anode.

At least one of the first electrode 110 or the second electrode 120 may be a transparent electrode or a semi-transmissive electrode.

The transparent electrode may have a transmittance of greater than or equal to about 80%, and within the above range, greater than or equal to about 85%, greater than or equal to about 88%, greater than or equal to about 90%, greater than or equal to about 92%, greater than or equal to about 95%, or greater than or equal to about 97%. The transparent electrode may include, for example, at least one of an oxide conductor, a carbon conductor, and/or a metal thin film. The oxide conductor may be for example one or more selected from indium tin oxide (ITO), indium zinc oxide (IZO), zinc tin oxide (ZTO), aluminum tin oxide (AlTO), and aluminum zinc oxide (AZO). The carbon conductor may be one or more selected from graphene and carbon nanostructure. The metal thin film may be for example formed with a thin thickness of several nanometers to several tens of nanometer thickness or may be a single layer or multiple layers of metal thin film formed with a thin thickness of several nanometers to tens of nanometer thickness and doped with metal oxide.

The semi-transmissive electrode may have a transmittance of about 10% to about 70%, about 20% to about 60%, or about 30% to about 50%, for example, selectively transmitting light in a particular (or, alternatively, predetermined) wavelength range and reflecting or absorbing light in other wavelength ranges. The semi-transmissive electrode may include a thin metal layer or alloy layer of, for example, about 1 nm to about 50 nm, and may include silver (Ag), copper (Cu), aluminum (Al), magnesium (Mg), ytterbium (Yb), magnesium-silver (Mg—Ag), magnesium-aluminum (Mg—Al), or a combination thereof, but the present inventive concepts are not limited thereto.

One of the first electrode 110 or the second electrode 120 may be a reflective electrode. The reflective electrode may include a reflective layer and may have a low transmittance of, for example, less than about 10% or less than or equal to about 5%. The light transmittance of the reflective electrode may be equal to or greater than 0%, equal to or greater than about 0.1%, equal to or greater than about 0.5%, equal to or greater than about 1%, or equal to or greater than about 5%. The reflective electrode may have a reflectance of greater than or equal to about 10%, greater than or equal to about 20%, greater than or equal to about 30%, greater than or equal to about 50%, or greater than or equal to about 70%. The reflectance of the reflective electrode may be equal to or less than 100%, equal to or less than about 99%, equal to or less than about 95%, equal to or less than about 90%, or equal to or less than about 80%. The reflective electrode may include a reflective conductor such as a metal, for example, silver (Ag), copper (Cu), aluminum (Al), gold (Au), titanium (Ti), chromium (Cr), nickel (Ni), ytterbium (Yb), an alloy thereof, a nitride thereof (e.g., TiN), or a combination thereof, but is not limited thereto.

For example, the first electrode 110 and the second electrode 120 may be a transparent electrode or a semi-transmissive electrode, respectively. As an example, the first electrode 110 may be a reflective electrode and the second electrode 120 may be a transparent electrode or a semi-transmissive electrode. As an example, the first electrode 110 may be a transparent electrode or a semi-transmissive electrode, and the second electrode 120 may be a reflective electrode.

The infrared photoelectric conversion layer 130 may be configured to absorb light (e.g., incident light) in at least a portion of the infrared wavelength spectrum and convert the absorbed light into an electrical signal. Such absorbing and photoelectric conversion of light in an infrared wavelength spectrum may be referred to herein as "sensing" and/or "detecting" said light in the infrared wavelength spectrum. The absorption spectrum of the infrared photoelectric conversion layer 130 may have, for example, a maximum absorption wavelength ($\lambda_{max,A}$) in a wavelength spectrum of greater than about 700 nm and less than or equal to about 3000 nm. The maximum absorption wavelength may belong to a wavelength spectrum of, for example, about 750 nm to about 3000 nm, about 750 nm to about 2500 nm, about 750 nm to about 2300 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, about 1000 nm to about 1500 nm, or about 750 nm to about 1000 nm.

The EQE spectrum of the infrared light sensor 100 (the infrared photoelectric conversion layer 130) may have a maximum EQE wavelength in a wavelength range of, for example, greater than about 700 nm and less than or equal to about 3000 nm. The maximum EQE wavelength may belong to a wavelength spectrum of, for example, about 800 nm to about 1500 nm, about 750 nm to about 3000 nm, about 750 nm to about 2500 nm, about 750 nm to about 2300 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm.

The infrared photoelectric conversion layer 130 may include at least one first material 130a and at least one second material 130b which form a pn junction (e.g., the second material 130b forms a pn junction with the first material 130a). The first material 130a and the second material 130b may be different from each other, and one of the first material 130a or the second material 130b may be a p-type semiconductor and the other may be an n-type semiconductor. As an example, the first material 130a may be a p-type semiconductor and the second material 130b may be an n-type semiconductor. For example, the first material 130a may be an n-type semiconductor and the second material 130b may be a p-type semiconductor.

Each of the first material 130a and the second material 130b may be an organic material, an inorganic material, or an organic-inorganic material. For example, at least one of the first material 130a or the second material 130b may be an organic material. For example, the first material 130a and the second material 130b may each be a non-polymeric material and may be a depositable compound. At least one of the first material 130a or the second material 130b may be a light absorbing material. For example, the first material 130a and the second material 130b may be light absorbing materials, respectively.

The first material 130a and the second material 130b may have different light absorption characteristics. For example, the absorption spectrum of the first material 130a and the absorption spectrum of the second material 130b may be different. For example, the maximum absorption wavelength of the absorption spectrum of the first material 130a and the maximum absorption wavelength of the absorption spectrum of the second material 130b may be different from each other. For example, the absorption spectrum of the first material 130a may be in a longer wavelength spectrum than the absorption spectrum of the second material 130b. The maximum absorption wavelength of the absorption spectrum of the first material 130a may be longer than the maximum absorption wavelength of the absorption spectrum of the second material 130b.

For example, the first material 130a may be an infrared absorbing material configured to mainly absorb light in the infrared wavelength spectrum, and the maximum absorption wavelength of the absorption spectrum of the first material 130a may belong to (e.g., may be in) the infrared wavelength spectrum. The maximum absorption wavelength of the absorption spectrum of the first material 130a may belong to, for example, greater than about 700 nm and less than or equal to about 3000 nm, and within the above range, for example about 750 nm to about 3000 nm, about 750 nm to about 2500 nm, about 750 nm to about 2300 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, about 750 nm to about 1000 nm, about 800 nm to about 3000 nm, about 800 nm to about 2500 nm, about 800 nm to about 2300 nm, about 800 nm to about 2000 nm, about 800 nm to about 1800 nm, about 800 nm to about 1500 nm, about 800 nm to about 1300 nm, about 800 nm to about 1200 nm, about 800 nm to about 1100 nm, about 800 nm to about 1000 nm, about 850 nm to about 3000 nm, about 850 nm to about 2500 nm, about 850 nm to about 2300 nm, about 850 nm to about 2000 nm, about 850 nm to about 1800 nm, about 850 nm to about 1500 nm, about 850 nm to about 1300 nm, about 850 nm to about 1200 nm, about 850 nm to about 1100 nm, or about 850 nm to about 1000 nm.

For example, the second material 130b may not be an infrared absorbing material configured to mainly absorb light in the infrared wavelength spectrum, and for example, the maximum absorption wavelength of the absorption spectrum of the second material 130b may not belong to the infrared wavelength spectrum. For example, the second material 130b may be a visible light absorbing material configured to mainly absorb light in the visible light wavelength spectrum, and the maximum absorption wavelength of the absorption spectrum of the second material 130b may belong to the visible light wavelength spectrum. The visible light wavelength spectrum may be, for example, greater than or equal to about 380 nm and less than about 700 nm, and within the above range, for example, about 380 nm to about 680 nm.

The first material 130a and the second material 130b may have different electrical properties. For example, the energy diagram of the first material 130a and the energy diagram of the second material 130b may be different.

For example, the first material 130a may have a relatively shallow HOMO energy level. For example, the HOMO energy level of the first material 130a may be about 4.5 eV to about 5.5 eV. The HOMO energy level of the second material 130b may be deeper than the HOMO energy level of the first material 130a, for example, a difference between the HOMO energy level of the second material 130b and the HOMO energy level of the first material 130a may be greater than or equal to about 0.5 eV, and within the above range, greater than or equal to about 0.7 eV, greater than or equal to about 0.8 eV, greater than or equal to about 0.9 eV, or greater than or equal to about 1.0 eV, for example, about 0.5 eV to about 2.0 eV, about 0.5 eV to about 1.8 eV, about 0.5 eV to about 1.7 eV, about 0.5 eV to about 1.5 eV, about 0.7 eV to about 2.0 eV, about 0.7 eV to about 1.8 eV, about 0.7 eV to about 1.7 eV, about 0.7 eV to about 1.5 eV, about 0.8 eV to about 2.0 eV, about 0.8 eV to about 1.8 eV, about 0.8 eV to about 1.7 eV or about 0.8 eV to about 1.5 eV, about 0.9 eV to about 2.0 eV, about 0.9 eV to about 1.8 eV, about 0.9 eV to about 1.7 eV or about 0.9 eV to about 1.5 eV, about 1.0 eV to about 2.0 eV, about 1.0 eV to about 1.8 eV, about 1.0 eV to about 1.7 eV, or about 1.0 eV to about 1.5 eV. For example, the HOMO energy level of the second material 130b may be about 5.6 eV to about 7.0 eV.

For example, the LUMO energy level of the first material 130a may be about 3.0 eV to about 4.5 eV. The LUMO energy level of the second material 130b may be deeper or shallower than the LUMO energy level of the first material 130a, for example, the LUMO energy level of the second material 130b may be about 3.6 eV to about 5.0 eV.

For example, the energy band gap of the first material 130a may be relatively narrow. The energy band gap of the first material 130a may be, for example, less than or equal to about 1.8 eV, less than or equal to about 1.7 eV, less than or equal to about 1.6 eV, less than or equal to about 1.5 eV, less than or equal to about 1.4 eV, less than or equal to about 1.3 eV, or less than or equal to about 1.2 eV, and within the above range, for example, about 0.5 eV to about 1.8 eV, about 0.5 eV to about 1.7 eV, about 0.5 eV to about 1.6 eV, about 0.5 eV to about 1.5 eV, about 0.5 eV to about 1.4 eV, about 0.5 eV to about 1.3 eV, or about 0.5 eV to about 1.2 eV.

For example, the energy band gap of the second material 130b may be wider than the energy band gap of the first material 130a. The energy band gap of the second material 130b may be, for example, wider than the energy band gap of the first material 130a by greater than or equal to about 0.3 eV, and within the above range, greater than or equal to about 0.5 eV, greater than or equal to about 0.7 eV, greater than or equal to about 0.8 eV, or greater than or equal to about 1.0 eV, for example, about 0.3 eV to about 2.0 eV, about 0.5 eV to about 2.0 eV, about 0.7 eV to about 2.0 eV, about 0.8 eV to about 2.0 eV, or about 1.0 eV to about 2.0 eV. For example, the energy band gap of the second material 130b may be about 0.8 eV to about 2.4 eV.

For example, the first material 130a may be selected from materials satisfying the aforementioned optical properties and electrical properties, and may include, for example, a metal phthalocyanine complex or a metal naphthalocyanine complex. Herein, the metal may be copper (Cu), tin (Sn), cobalt (Co), iron (Fe), nickel (Ni), zinc (Zn), magnesium (Mg), or a combination thereof, but is not limited thereto.

For example, the second material 130b may be selected from materials satisfying the aforementioned optical properties and electrical properties, and may include, for example, fullerene or a fullerene derivative.

The first material 130a and the second material 130b may be blended in the form of bulk heterojunction. In the drawing, an example of blending the first material 130a and the second material 130b is shown but a shape and morphology of the first material 130a and the second material 130b are not limited thereto, for example, the first material 130a and the second material 130b may be in contact with each other.

The first material 130a and the second material 130b may be included in a particular (or, alternatively, predetermined) composition ratio, wherein the composition ratio may be defined as a ratio of a volume or thickness of the first material 130a relative to volume or thickness of the second material 130b.

For example, the first material 130a may be included in the infrared photoelectric conversion layer 130 in a smaller amount than that of the second material 130b, for example, the composition ratio of the first material 130a relative to the second material 130b in the infrared photoelectric conversion layer 130 may be about 0.10:1 to about 0.90:1. The composition ratio of the first material 130a relative to the second material 130b in the infrared photoelectric conversion layer 130 may be, within the above range, about 0.10:1 to about 0.80:1, about 0.10:1 to about 0.70:1, about 0.10:1 to about 0.50:1, or about 0.10:1 to about 0.30:1. In this way, in the infrared photoelectric conversion layer 130, the composition ratio of second material 130b having a relatively deeper HOMO energy level than that of the first material 130a may be increased to form a sufficient energy barrier and thus may prevent carrier charges from reversely flowing from the first electrode 110 or the second electrode 120 to the infrared photoelectric conversion layer 130, resultantly suppressing a dark current.

The infrared photoelectric conversion layer 130 further include a third material 130c, in addition to the first material 130a and the second material 130b. The third material 130c may be respectively different from the first material 130a and the second material 130b and a dopant modifying properties of the infrared photoelectric conversion layer 130.

The third material 130c may be an organic material, for example, a non-polymeric material, for example, a depositable organic compound. For example, the infrared photoelectric conversion layer 130 may be a co-deposited thin film of the first material 130a, the second material 130b, and the third material 130c, and a blended film of the first material 130a, the second material 130b, and the third material 130c.

The third material 130c may be, for example, a non-absorbing material for visible light and may not substantially absorb, for example, visible light of wavelength spectrum of greater than or equal to about 380 nm and less than about 750 nm. The third material 130c may be, for example, a charge transport material, for example, a hole transport material or an electron transport material.

The third material 130c may have electrical properties respectively differing from those of the first material 130a and the second material 130b, for example, an energy diagram respectively differing from those of the first material 130a and the second material 130b.

For example, the energy band gap of the third material 130c may be respectively greater than those of the first material 130a and the second material 130b (e.g., greater than both the energy band gap of the first material 130a and the energy band gap of the second material 130b).

The energy band gap of the third material 130c may be, for example, wider (e.g., greater) than the energy band gap of the first material 130a, by greater than or equal to about 1.0 eV, and within the above range, for example, greater than or equal to about 1.2 eV, greater than or equal to about 1.5 eV, or greater than or equal to about 1.7 eV, for example about 1.0 eV to about 5.0 eV, about 1.2 eV to about 5.0 eV, about 1.5 eV to about 5.0 eV, about 1.7 eV to about 5.0 eV, about 1.0 eV to about 4.5 eV, about 1.2 eV to about 4.5 eV, about 1.5 eV to about 4.5 eV, about 1.7 eV to about 4.5 eV, about 1.0 eV to about 4.0 eV, about 1.2 eV to about 4.0 eV, about 1.5 eV to about 4.0 eV, about 1.7 eV to about 4.0 eV, about 1.0 eV to about 3.5 eV, about 1.2 eV to about 3.5 eV, about 1.5 eV to about 3.5 eV, or about 1.7 eV to about 3.5 eV.

The energy band gap of the third material 130c may be wider (e.g., greater) than the energy band gap of the second material 130b, by greater than or equal to about 0.5 eV, and within the above range, greater than or equal to about 0.7 eV, greater than or equal to about 0.9 eV, or greater than or equal to about 1.1 eV, for example, about 0.5 eV to about 3.0 eV, about 0.7 eV to about 3.0 eV, about 0.9 eV to about 3.0 eV, about 1.1 eV to about 3.0 eV, about 0.5 eV to about 2.5 eV, about 0.7 eV to about 2.5 eV, about 0.9 eV to about 2.5 eV, about 1.1 eV to about 2.5 eV, about 0.5 eV to about 2.0 eV, about 0.7 eV to about 2.0 eV, about 0.9 eV to about 2.0 eV, or about 1.1 eV to about 2.0 eV.

The energy band gap of the third material 130c may be, for example, greater than or equal to about 2.8 eV, and within the above range, about 2.8 eV to about 4.0 eV, about 2.8 eV to about 3.8 eV, or about 2.8 eV to about 3.5 eV.

For example, the HOMO energy level of the third material 130c may be equal to that of the first material 130a or a difference between the HOMO energy level of the first material 130a and the HOMO energy level of the third material 130c may not be significant. For example, a difference between the HOMO energy level of the third material 130c and the HOMO energy level of the first material 130a may be for example, less than about 1.0 eV, for example, less than or equal to about 0.9 eV, less than or equal to about 0.7 eV, less than or equal to about 0.5 eV, less than or equal to about 0.3 eV, less than or equal to about 0.2 eV, or less than or equal to about 0.1 eV. The difference between the HOMO energy level of the third material 130c and the HOMO energy level of the first material 130a may be for example, greater than or equal to about 0.001 eV, for example, greater than or equal to about 0.01 eV, or greater than or equal to about 0.05 eV. For example, the HOMO energy level of the third material 130c may be equal to or deeper than that of the first material 130a within a range of greater than about 0 and less than about 1.0 eV, and the HOMO energy level of the third material 130c may be deeper than that of the first material 130a within a range of about 0.001 eV to about 0.9 eV, about 0.001 eV to about 0.7 eV, about 0.001 eV to about 0.5 eV, about 0.001 eV to about 0.3 eV, about 0.001 eV to about 0.2 eV, or about 0.001 eV to about 0.1 eV. For example, the HOMO energy level of the third material 130c may be equal to or shallower than that of the first material 130a within a range of greater than about 0 and less than about 1.0 eV, and the HOMO energy level of the third material 130c may be shallower than that of the first material 130a within a range of about 0.001 eV to about 0.9 eV, about 0.001 eV to about 0.7 eV, about 0.001 eV to about 0.5 eV, about 0.001 eV to about 0.3 eV, about 0.001 eV to about 0.2 eV, or about 0.001 eV to about 0.1 eV.

The third material 130c having these electrical properties may be blended with the first material 130a and the second material 130b in the infrared photoelectric conversion layer 130 such that the infrared photoelectric conversion layer 130 comprises a mixture of the first material 130a, the second material 130b, and the third material 130c, and the infrared photoelectric conversion layer 130 including a mixture of the first material 130a, the second material 130b, and the third material 130c, as described above, which have different electrical properties one another, may have different properties from those of an infrared photoelectric conversion layer including a mixture of the first material 130a and the second material 130b without the third material 130c.

For example, the infrared photoelectric conversion layer 130 may include a plurality of charge carrier trapping sites intentionally or unintentionally formed by a conformation of molecules themselves of the first material 130a and/or the second material 130b, such as arrangement, alignment, and/or stacking of the molecules. For example, most of the charge trap sites of the infrared photoelectric conversion layer 130 may be distributed between the HOMO energy level and the LUMO energy level of the first material 130a, for example, mainly between the HOMO energy level of the first material 130a and the middle of the energy band gap of the first material 130a, and for example, closer to the middle of the energy band gap between the HOMO energy level of the first material 130a and the middle of the energy band gap of the first material 130a (so-called, "deep hole-traps"). Although not bound by a specific theory, the third material 130c may fill at least a portion of the charge trap sites and thus lower density of the charge trap sites in the infrared photoelectric conversion layer 130 and resultantly, effectively control a dark current possibly generated by the charge trap sites in the infrared photoelectric conversion layer 130.

For example, the third material 130c may change the absorption spectrum and/or the EQE spectrum of the infrared photoelectric conversion layer 130, and the absorption spectrum and/or the EQE spectrum of the infrared photoelectric conversion layer 130 formed of the first material 130a, the second material 130b, and the third material 130c may be shifted toward a longer wavelength region, compared with an absorption spectrum and/or an EQE spectrum of the infrared photoelectric conversion layer formed of the first material 130a and the second material 130b without the third material 130c (hereinafter referred to as comparative infrared photoelectric conversion layer). For example, the maximum absorption wavelength (maximum EQE wavelength) of the infrared photoelectric conversion layer 130 formed of the first material 130a, the second material 130b, and the third material 130c may be longer than that of the infrared photoelectric conversion layer formed of the first material 130a and the second material 130b without the third material 130c. For example, the maximum absorption wavelength (maximum EQE wavelength) of the infrared photoelectric conversion layer 130 formed of the first material 130a, the second material 130b, and the third material 130c may be longer than that of the infrared photoelectric conversion layer formed of the first material 130a and the second material 130b without the third material 130c, by greater than or equal to about 30 nm, for example, greater than or equal to about 40 nm, greater than or equal to about 50 nm, greater than or equal to about 60 nm, greater than or equal to about 70 nm, about 30 nm to about 300 nm, about 40 nm to about 300 nm, about 50 nm to about 300 nm, about 60 nm to about 300 nm, about 70 nm to about 300 nm, about 30 nm to about 200 nm, about 40 nm to about 200 nm, about 50 nm to about 200 nm, about 60 nm to about 200 nm, about 70 nm to about 200 nm, about 30 nm to about 180 nm, about 40 nm to about 180 nm, about 50 nm to about 180 nm, about 60 nm to about 180 nm, about 70 nm to about 180 nm, about 30 nm to about 160 nm, about 40 nm to about 160 nm, about 50 nm to about 160 nm, about 60 nm to about 160 nm, about 70 nm to about 160 nm, about 30 nm to about 140 nm, about 40 nm to about 140 nm, about 50 nm to about 140 nm, about 60 nm to about 140 nm, about 70 nm to about 140 nm, about 30 nm to about 120 nm, about 40 nm to about 120 nm, about 50 nm to about 120 nm, about 60 nm to about 120 nm, or about 70 nm to about 120 nm.

For example, the absorption spectrum of the infrared photoelectric conversion layer 130 formed of the first material 130a, the second material 130b, and the third material 130c may be shifted toward a longer wavelength region, compared with an absorption spectrum of the first material 130a (a thin film formed of the first material 130a), for example, the maximum absorption wavelength of the infrared photoelectric conversion layer 130 formed of the first material 130a, the second material 130b, and the third material 130c may be a longer wavelength than that of the first material 130a. For example, the maximum absorption wavelength of the infrared photoelectric conversion layer 130 may be longer than that of the first material 130a, by greater than or equal to about 30 nm, for example, greater than or equal to about 40 nm, greater than or equal to about 50 nm, greater than or equal to about 60 nm, greater than or equal to about 70 nm, about 30 nm to about 500 nm, about 40 nm to about 500 nm, about 50 nm to about 500 nm, about 60 nm to about 500 nm, about 70 nm to about 500 nm, about 30 nm to about 450 nm, about 40 nm to about 450 nm, about 50 nm to about 450 nm, about 60 nm to about 450 nm, about 70 nm to about 450 nm, about 30 nm to about 400 nm, about 40 nm to about 400 nm, about 50 nm to about 400 nm, about 60 nm to about 400 nm, about 70 nm to about 400 nm, about 30 nm to about 380 nm, about 40 nm to about 380 nm, about 50 nm to about 380 nm, about 60 nm to about 380 nm, about 70 nm to about 380 nm, about 30 nm to about 360 nm, about 40 nm to about 360 nm, about 50 nm to about 360 nm, about 60 nm to about 360 nm, about 70 nm to about 360 nm, about 30 nm to about 300 nm, about 40 nm to about 300 nm, about 50 nm to about 300 nm, about 60 nm to about 300 nm, about 70 nm to about 300 nm, about 30 nm to about 280 nm, about 40 nm to about 280 nm, about 50 nm to about 280 nm, about 60 nm to about 280 nm or about 70 nm to about 280 nm.

For example, as the third material 130c is more included in the infrared photoelectric conversion layer 130 (e.g., as a content of the third material 130c in the infrared photoelectric conversion layer 130 increases), the maximum absorption wavelength (maximum EQE wavelength) of the infrared photoelectric conversion layer 130 may be further shifted toward the longer wavelength region. For example, when the third material 130c is included in an amount of less than or equal to about 10 volume % based on a total volume of the infrared photoelectric conversion layer 130, the maximum absorption wavelength (maximum EQE wavelength) of the infrared photoelectric conversion layer 130 may be about 30 nm to about 70 nm more shifted toward the longer wavelength region than that of the comparative infrared photoelectric conversion layer. For example, when third material 130c is included in an amount of greater than about 10 volume % and less than or equal to about 20 volume % based on a total volume of the infrared photoelectric conversion layer 130, the maximum absorption wavelength (maximum EQE wavelength) of the infrared photoelectric conversion layer 130 may be about 40 nm to about 200 nm more shifted toward the longer wavelength region than that of the comparative infrared photoelectric conversion layer. For example, when the third material 130c is included in an amount of greater than about 20 volume % and less than or equal to about 40 volume % based on a total volume of the infrared photoelectric conversion layer 130, the maximum absorption wavelength (maximum EQE wavelength) of the infrared photoelectric conversion layer 130 may be about 50 nm to about 400 nm more shifted toward the longer wavelength region than that of the comparative infrared photoelectric conversion layer.

For example, the maximum absorption wavelength (maximum EQE wavelength) of the infrared photoelectric conversion layer 130, which may be the maximum EQE wavelength of the infrared light sensor 100, may be, for example, greater than or equal to about 800 nm and less than or equal to about 3000 nm, and within the above range, for example, about 800 nm to about 2500 nm, about 800 nm to about 2300 nm, about 800 nm to about 2000 nm, about 800 nm to about 1800 nm, about 800 nm to about 1500 nm, about 800 nm to about 1300 nm, about 800 nm to about 1200 nm, about 800 nm to about 1100 nm, about 850 nm to about 3000 nm, about 850 nm to about 2500 nm, about 850 nm to about 2300 nm, about 850 nm to about 2000 nm, about 850 nm to about 1800 nm, about 850 nm to about 1500 nm, about 850 nm to about 1300 nm, about 850 nm to about 1200 nm or about 850 nm to about 1100 nm.

The third material 130c has no particular limit, but may include any material changing electrical properties and the optical spectrum (EQE spectrum) of the infrared photoelectric conversion layer 130, for example, an organic material, or for example, a non-polymeric material.

The third material 130c may be, for example, an organic compound having a planar-type core, for example, a planar-type organic compound having at least one arylamine group.

For example, the third material 130c may be represented by Chemical Formula 1.

[Chemical Formula 1]

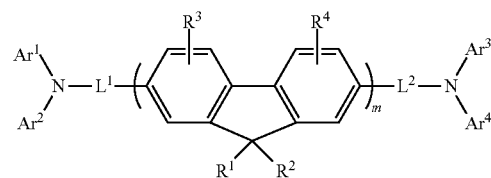

In Chemical Formula 1,
$L^1$ and $L^2$ may independently be a single bond, a substituted or unsubstituted C1 to C30 alkylene group, a substituted or unsubstituted C6 to C30 arylene group, or a combination thereof,
$Ar^1$ to $Ar^4$ may independently be a substituted or unsubstituted C6 to C30 aryl group,
$Ar^1$ and $Ar^2$ may independently be present or be combined to each other to form a ring, Ar³ and Ar⁴ may independently be present or be combined to each other to form a ring, R¹ to R⁴ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a halogen, a cyano group, or a combination thereof, R¹ to R⁴ may independently be present or two of R¹ to R⁴ that are adjacent to each other may be combined to form a ring, and m is an integer of 0 to 2.

For example, L¹ and L² may independently be a single bond, a substituted or unsubstituted phenylene group, a substituted or unsubstituted naphthylene group, a substituted or unsubstituted biphenylene group, or a combination thereof.

For example, when m is 0, at least one of L¹ or L² may be a substituted or unsubstituted phenylene group, a substituted or unsubstituted naphthylene group, a substituted or unsubstituted biphenylene group, or a combination thereof.

For example, Ar¹ to Ar⁴ may independently be a substituted or unsubstituted phenyl group, a substituted or unsubstituted naphthyl group, a substituted or unsubstituted biphenyl group, or a combination thereof.

For example, Ar¹ and Ar² may be combined with each other to form a ring.

For example, Ar³ and Ar⁴ may be combined with each other to form a ring.

For example, R¹ and R² may each be a substituted or unsubstituted phenyl group or may be combined with each other to form a ring.

For example, the third material 130c may be represented by one of Chemical Formulas 1-1 to 1-8, but is not limited thereto.

[Chemical Formula 1-1]

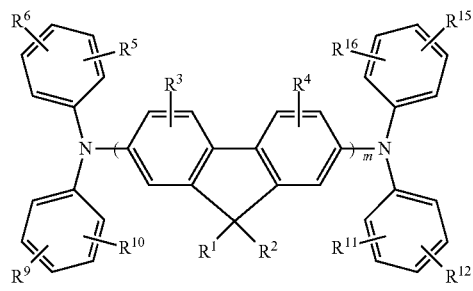

[Chemical Formula 1-2]

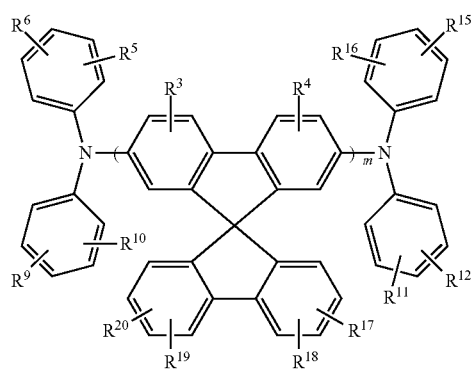

[Chemical Formula 1-3]

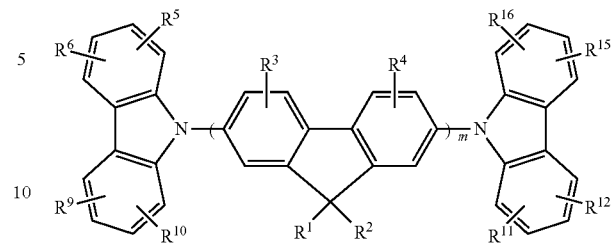

[Chemical Formula 1-4]

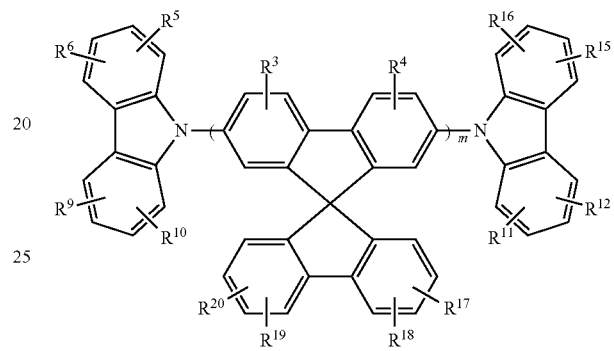

[Chemical Formula 1-5]

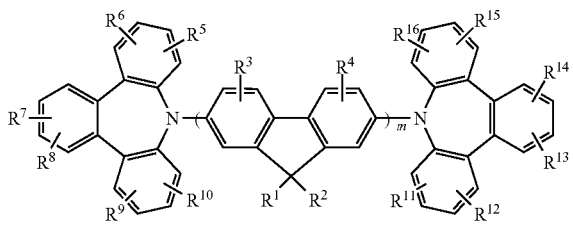

[Chemical Formula 1-6]

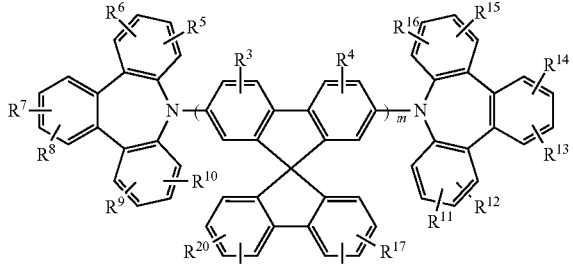

[Chemical Formula 1-7]

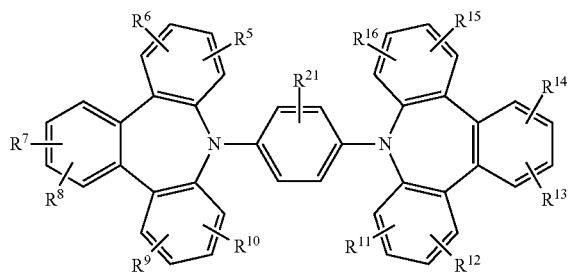

-continued

[Chemical Formula 1-8]

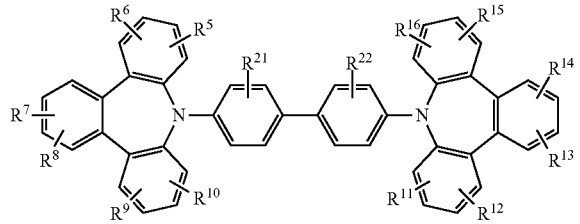

In Chemical Formulas 1-1 to 1-8,
$R^1$ to $R^{22}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, a halogen, a cyano group, or a combination thereof,
$R^1$ to $R^{22}$ may independently be present or two of $R^1$ to $R^{22}$ that are adjacent to each other may be combined to form a ring, and
m may be 1 or 2.

The third material 130c may be included within any content range that does not affect stability of molecules of the first material 130a and the second material 130b and other properties required from the infrared photoelectric conversion layer 130, for example, in a smaller amount than the second material 130b. For example, the third material 130c may be included, in the infrared photoelectric conversion layer 130, in an amount of less than or equal to about 40 volume %, and within the above range, about 1 volume % to about 40 volume %, about 5 volume % to about 40 volume %, about 5 volume % to about 35 volume %, about 5 volume % to about 30 volume %, about 5 volume % to about 25 volume %, about 7 volume % to about 40 volume %, about 7 volume % to about 35 volume %, about 7 volume % to about 30 volume %, about 7 volume % to about 25 volume %, about 8 volume % to about 40 volume %, about 8 volume % to about 35 volume %, about 8 volume % to about 30 volume %, about 8 volume % to about 25 volume %, about 10 volume % to about 40 volume %, about 10 volume % to about 35 volume %, about 10 volume % to about 30 volume %, about 10 volume % to about 25 volume %, about 15 volume % to about 40 volume %, about 15 volume % to about 35 volume %, about 15 volume % to about 30 volume %, or about 15 volume % to about 25 volume %, based on a total volume of the infrared photoelectric conversion layer 130. Each of the first material 130a and the third material 130c may be included in the infrared photoelectric conversion layer 130 in a smaller amount than the second material 130b.

The infrared photoelectric conversion layer 130 may be an intrinsic layer in which the first material 130a, the second material 130b, and the third material 130c are blended in a form of bulk heterojunction.

The infrared photoelectric conversion layer 130 may be a ternary system of the first material 130a, the second material 130b, and the third material 130c.

A thickness of the infrared photoelectric conversion layer 130 may be about 100 nm to about 700 nm, and within the above range, about 120 nm to about 600 nm, about 150 nm to about 500 nm, about 200 nm to about 500 nm, or about 230 nm to about 500 nm.

The infrared light sensor 100 may further include an anti-reflection layer (not shown) under the first electrode 110 or on the second electrode 120. The anti-reflection layer is disposed at a light incidence side and may lower reflectance of incident light and thereby light absorbance may be further improved. For example, when light enters from the first electrode 110, the anti-reflection layer may be disposed under the first electrode 110, while when light enters from the second electrode 120, the anti-reflection layer may be disposed on the second electrode 120.

The anti-reflection layer may include, for example a material having a refractive index of about 1.6 to about 2.5 and may include for example at least one of a metal oxide, a metal sulfide, or an organic material having a refractive index within the above ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

For example, when one of the first electrode 110 or the second electrode 120 may be a transparent electrode or a semi-transmissive electrode, while the other of the first electrode 110 and the second electrode 120 is a reflective electrode, the infrared light sensor 100 may form a microcavity structure. Due to the microcavity structure, incident light may be repeatedly reflected between the first electrode 110 and the second electrode 120 which are separated by a particular (or, alternatively, predetermined) gap (optical path length) to enhance light of a particular (or, alternatively, predetermined) wavelength spectrum. Herein, the optical path length may be a gap between the first electrode 110 and the second electrode 120, for example, a thickness of the infrared photoelectric conversion layer 130. For example, light of a particular (or, alternatively, predetermined) wavelength spectrum out of the incident light may be repeatedly reflected and modified between the reflective electrode and the transparent electrode or the semi-transmissive electrode, and out of the modified light, light of a wavelength spectrum corresponding to a resonance wavelength of micro-resonance may be enhanced to exhibit amplified photoelectric conversion characteristics in a narrow wavelength spectrum. The resonance wavelength of the microcavity may belong to the absorption spectrum of the aforementioned infrared photoelectric conversion layer 130, for example, greater than or equal to about 800 nm and less than or equal to about 3000 nm, and within the above range, for example about 800 nm to about 2500 nm, about 800 nm to about 2300 nm, about 800 nm to about 2000 nm, about 800 nm to about 1800 nm, about 800 nm to about 1500 nm, about 800 nm to about 1300 nm, about 800 nm to about 1200 nm, about 800 nm to about 1100 nm, about 850 nm to about 3000 nm, about 850 nm to about 2500 nm, about 850 nm to about 2300 nm, about 850 nm to about 2000 nm, about 850 nm to about 1800 nm, about 850 nm to about 1500 nm, about 850 nm to about 1300 nm, about 850 nm to about 1200 nm, or about 850 nm to about 1100 nm.

In the infrared light sensor 100, light enters from the first electrode 110 or the second electrode 120, and the infrared photoelectric conversion layer 130 absorbs light of a particular (or, alternatively, predetermined) wavelength spectrum, thereby generating excitons therein. The excitons may be separated into holes and electrons in the infrared photoelectric conversion layer 130, and the separated holes may move to the anode that is one of the first electrode 110 or the second electrode 120, and the separated electrons may move to the cathode that is the other of the first electrode 110 and the second electrode 120, so as to flow a current.

As described above, the infrared photoelectric conversion layer 130 further includes a third material 130c, in addition to the first material 130a and the second material 130b forming a pn junction, and thus may improve characteristics of the infrared photoelectric conversion layer 130. Accordingly, the optical and electrical properties of the infrared light sensor 100 may be improved.

For example, as described above, since the third material 130c may effectively lower the density of the charge trap site(region) in the infrared photoelectric conversion layer 130, dark current characteristics of the infrared light sensor 100 may be improved, and ultimately, electrical properties of the infrared light sensor 100 may be improved.

For example, as described above, since the third material 130c may shift the absorption spectrum of the infrared photoelectric conversion layer 130 toward the longer wavelength spectrum, material limitations of infrared absorption properties of the first material 130a may be overcome, and an infrared sensor sensing light in a much longer wavelength spectrum than the absorption region of the first material 130a may be realized.

The infrared light sensor 100 may be applied to a variety of sensors for sensing light in infrared wavelength spectrum, for example a sensor to improve sensitivity in low-illumination environments, a sensor to extend a dynamic range specifically classifying a black/white contrast and thus to increase sensing capability of a long distance 3-dimensional image, or a biometric sensor. The biometric sensor may be for example an iris sensor, a depth sensor, a fingerprint sensor, or a blood vessel distribution sensor, but is not limited thereto. The infrared light sensor 100 may be for example applied to a CMOS infrared light sensor or a CMOS image sensor.

It will be understood that the material composition of the infrared photoelectric conversion layer 130 may be referred to, independently of the structure of the infrared light sensor 100, as a composition having properties, material compositions, and the like of any of the example embodiments of the infrared photoelectric conversion layer 130. Accordingly, any description herein regarding properties, compositions, and the like regarding the infrared photoelectric conversion layer 130 may be understood to also provide a description of a composition having the same properties, compositions and the like according to any of the example embodiments, where the composition may be used to form the infrared photoelectric conversion layer 130. For example, a composition according to some example embodiments may include any combination of the first material 130a, the second material 130b, and the third material 130c according to any of the example embodiments as described herein with regard to the first material 130a, the second material 130b, and the third material 130c of the infrared photoelectric conversion layer 130 (e.g., a first material 130a having a maximum absorption wavelength in an infrared wavelength spectrum, a second material 130b forming a pn junction with the first material, and a third material 130c having an energy band gap that is greater than both an energy band gap of the first material 130a and an energy band gap of the second material 130b, wherein a maximum absorption wavelength of the composition is a longer wavelength than the maximum absorption wavelength of the first material 130a). The composition may be formed based on co-depositing a thin film of the first material 130a, the second material 130b, and the third material 130c. The composition may be formed based on blending the first material 130a, the second material 130b, and the third material 130c together. The composition may be formed based on blending the first material 130a, the second material 130b, and the third material 130c in a form of bulk heterojunction. In addition, in infrared light sensor 100, the infrared photoelectric conversion layer 130 may include a composition that includes any mixture of the first material 130a, the second material 130b, and the third material 130c according to any of the example embodiments.

Hereinafter, a sensor according to some example embodiments is described.

Figure 2:
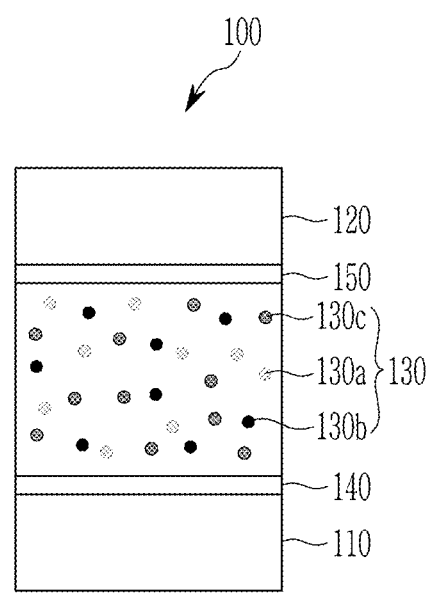
FIG. 2 is a cross-sectional view showing another example of an infrared sensor according to some example embodiments.

FIG. 2 is a cross-sectional view showing another example of an infrared light sensor according to some example embodiments.

Referring to FIG. 2, an infrared light sensor 100 according to some example embodiments includes a first electrode 110 and a second electrode 120 facing each other, and an infrared photoelectric conversion layer 130 between the first electrode 110 and second electrode 120, like some example embodiments, including the example embodiments shown in FIG. 1. The first electrode 110, the second electrode 120, and the infrared photoelectric conversion layer 130 are the same as described above.

However, unlike some example embodiments, including the example embodiments shown in FIG. 1, the infrared light sensor 100 according to the present example further includes auxiliary layers 140 and 150 between the first electrode 110 and the infrared photoelectric conversion layer 130 and/or between the second electrode 120 and the infrared photoelectric conversion layer 130. The auxiliary layers 140 and 150 may be a charge auxiliary layer that may control transport rates of hole and/or electron separated from the infrared photoelectric conversion layer 130, an optical auxiliary layer that may control the absorption of incident light, or a combination thereof.

For example, when the first electrode 110 is an anode and the second electrode 120 is a cathode, the auxiliary layer 140 may be a hole injection layer (HIL) for facilitating hole injection to the anode, a hole transport layer (HTL) for facilitating hole transport to the anode, and/or an electron blocking layer (EBL) for preventing electron transport to the anode, and the auxiliary layer 150 may be an electron injection layer (EIL) for facilitating electron injection to the cathode, an electron transport layer (ETL) for facilitating electron transport to the cathode, and/or a hole blocking layer (HBL) for preventing hole transport to the cathode.

For example, the auxiliary layer 140 may be a hole transport layer and/or an electron blocking layer, and may include a fourth material having a wide energy band gap. The energy band gap of the fourth material may be wider (e.g., greater) than the energy band gaps of the first material 130a and the second material 130b included in the infrared photoelectric conversion layer 130. For example, the energy band gap of the fourth material may be wider than the energy band gap of the first material 130a, by greater than or equal to about 1.0 eV, and within the above range, greater than or equal to about 1.0 eV, and within the above range, for example, greater than or equal to about 1.2 eV, greater than or equal to about 1.5 eV, or greater than or equal to about 1.7 eV, for example about 1.0 eV to about 5.0 eV, about 1.2 eV to about 5.0 eV, about 1.5 eV to about 5.0 eV, about 1.7 eV to about 5.0 eV, about 1.0 eV to about 4.5 eV, about 1.2 eV to about 4.5 eV, about 1.5 eV to about 4.5 eV, about 1.7 eV to about 4.5 eV, about 1.0 eV to about 4.0 eV, about 1.2 eV to about 4.0 eV, about 1.5 eV to about 4.0 eV, about 1.7 eV to about 4.0 eV, about 1.0 eV to about 3.5 eV, about 1.2 eV to about 3.5 eV, about 1.5 eV to about 3.5 eV, or about 1.7 eV to about 3.5 eV. For example, the energy band gap of the fourth material may be wider than the energy band gap of the second material 130b, by greater than or equal to about 0.5 eV, and within the above range, greater than or equal to about 0.7 eV, greater than or equal to about 0.9 eV, or greater than or equal to about 1.1 eV, for example, about 0.5 eV to about 3.0 eV, about 0.7 eV to about 3.0 eV, about 0.9 eV to about 3.0 eV, about 1.1 eV to about 3.0 eV, about 0.5 eV to about 2.5 eV, about 0.7 eV to about 2.5 eV, about 0.9 eV to about 2.5 eV, about 1.1 eV to about 2.5 eV, about 0.5 eV to about 2.0 eV, about 0.7 eV to about 2.0 eV, about 0.9 eV to about 2.0 eV, or about 1.1 eV to about 2.0 eV. The energy band gap of the fourth material may be, for example, greater than or equal to about 2.8 eV, and within the above range, about 2.8 eV to about 4.0 eV, about 2.8 eV to about 3.8 eV, or about 2.8 eV to about 3.5 eV.

The HOMO energy level of the fourth material may be between a work function of the first electrode 110 and the HOMO energy level of the first material 130a of the infrared photoelectric conversion layer 130, for example, the work function of the first electrode 110, the HOMO energy level of the fourth material, and the HOMO energy level of the first material 130a of the infrared photoelectric conversion layer 130 may be a stepwise-type. For example, the HOMO energy level of the fourth material may be about 4.8 eV to about 5.4 eV and within the above range, about 4.9 eV to about 5.4 eV or about 5.0 eV to about 5.4 eV. The auxiliary layer 140 includes a fourth material having these electrical properties and thus may effectively transport or extract holes from the infrared photoelectric conversion layer 130 to the first electrode 110 and simultaneously, effectively block a reverse flow of electrons from the first electrode 110 to the infrared photoelectric conversion layer 130, when a reverse bias is applied thereto.

The fourth material may be the same as or different from the third material 130c described above.

For example, when the first electrode 110 is a cathode and the second electrode 120 is an anode, the auxiliary layer 140 may be a an electron injection layer (EIL) for facilitating electron injection, an electron transport layer (ETL) for facilitating electron transport, and/or a hole blocking layer (HBL) for preventing hole transport, and the auxiliary layer 150 may be a hole injection layer (HIL) for facilitating hole injection, a hole transport layer (HTL) for facilitating hole transport, and/or an electron blocking layer (EBL) for preventing electron transport.

For example, at least one of the auxiliary layers 140 and/or 150 may include one of a first material 130a, a second material 130b, or a third material 130c. For example, the auxiliary layer 140 may include a third material 130c. For example, the auxiliary layer 150 may include the second material 130b. For example, the auxiliary layer 140 and/or the auxiliary layer 150 may include the first material 130a. In an example, the fourth material may be represented by one of Chemical Formulae C-1 to C-9 as presented further below.

Any one of the auxiliary layers 140 and/or 150 may be omitted.

Figure 3:
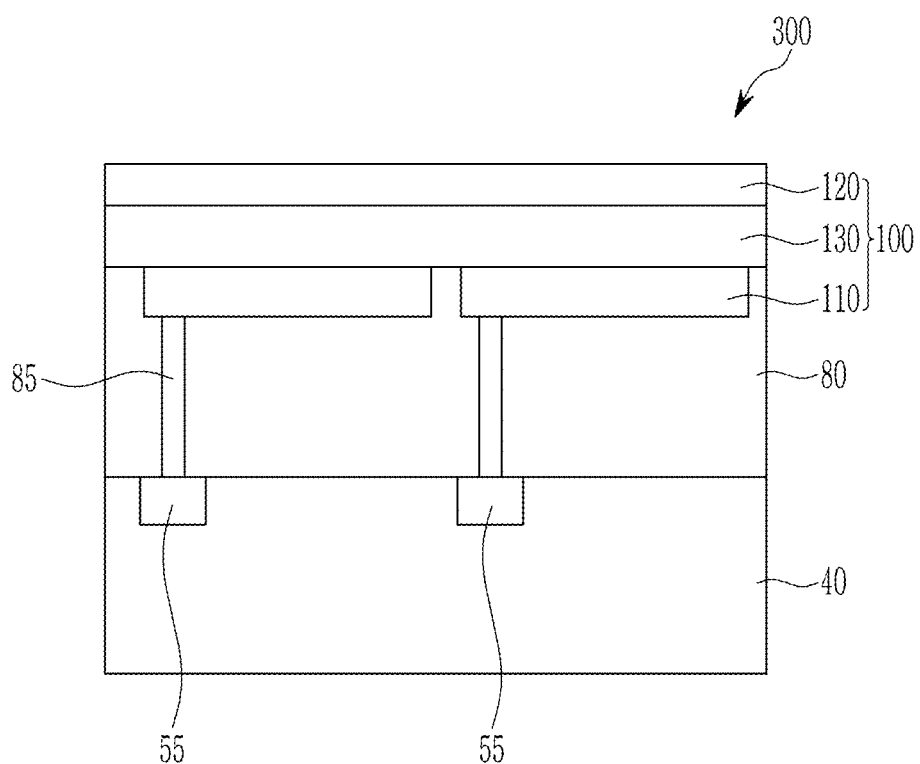
FIG. 3 is a cross-sectional view showing an example of a sensor according to some example embodiments.

FIG. 3 is a cross-sectional view showing an example of a sensor according to some example embodiments.

The sensor 300 according to some example embodiments includes a semiconductor substrate 40, an insulation layer 80, and an infrared light sensor 100.

The semiconductor substrate 40 may be a silicon substrate and is integrated with a transmission transistor (not shown) and a charge storage 55. The charge storage 55 may be integrated in each pixel. The charge storage 55 is electrically connected to the infrared light sensor 100 and information of the charge storage 55 may be transmitted by the transmission transistor.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), or alloys thereof, but is not limited thereto. However, it is not limited to the structure and the metal wire and pads may be disposed under the semiconductor substrate 40.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned infrared light sensor 100 is formed on the insulation layer 80. The infrared light sensor 100 includes the first electrode 110, the second electrode 120, and the infrared photoelectric conversion layer 130, as described above, and may further optionally include a charge auxiliary layer (not shown). The first electrode 110, the second electrode 120, and the infrared photoelectric conversion layer 130 are as described above.

The second electrode 120 may be an incident electrode through which light is incident. Light of the infrared wavelength spectrum among the light incident through the second electrode 120 may be effectively absorbed by the infrared photoelectric conversion layer 130 and then photo-electrically converted. As described above, the dark current may be effectively suppressed under a reverse bias voltage, thereby exhibiting good photoelectric conversion characteristics by a combination of the first material 130a, the second material 130b, and the third material 130c of the infrared photoelectric conversion layer 130.

In FIG. 3, as an example, the sensor 300 includes the infrared light sensor 100 of FIG. 1, but is not limited thereto. The sensor 300 may include the infrared light sensor 100 of FIG. 2.

Focusing lens (not shown) may be further formed on the infrared light sensor 100. The focusing lens may control a direction of incident light and gather the light in one region. The focusing lens may have a shape of, for example, a cylinder or a hemisphere, but is not limited thereto.

Figure 4:
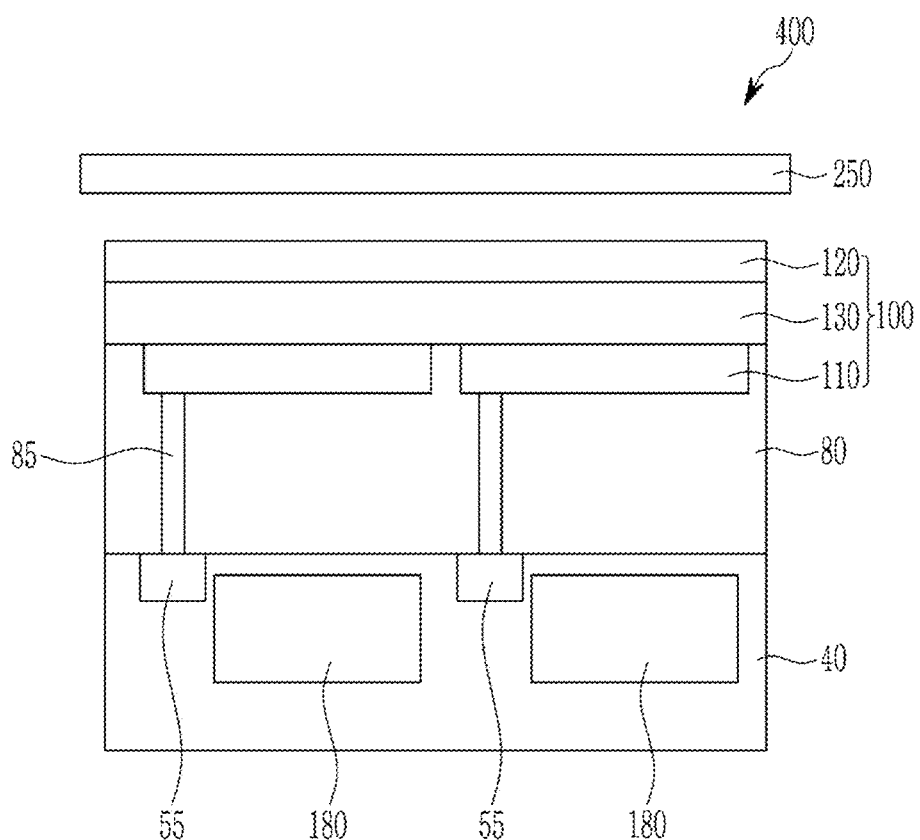
FIG. 4 is a cross-sectional view showing an example of a sensor according to some example embodiments.

FIG. 4 is a cross-sectional view showing an example of a sensor according to some example embodiments.

The sensor according to some example embodiments, including the example embodiments shown in FIG. 4, may include a plurality of sensors having different functions. At least one of a plurality of sensors having different functions may be a biometric sensor. The biometric sensor may be for example an iris sensor, a depth sensor, a fingerprint sensor, or a blood vessel distribution sensor, but is not limited thereto. For example, one of a plurality of sensors having different functions may be an iris sensor and the other may be a depth sensor.

For example, a plurality of sensors may include a first infrared light sensor configured to sense infrared light having a first wavelength ($\lambda_1$) within an infrared wavelength spectrum and a second infrared light sensor configured to sense infrared light having a second wavelength ($\lambda_2$) within an infrared wavelength spectrum.

The first wavelength ($\lambda_1$) and the second wavelength ($\lambda_2$) may differ from each other within a wavelength spectrum of for example greater than about 700 nm and less than or equal to about 3000 nm. For example, a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) or the second wavelength ($\lambda_2$) may be within a wavelength spectrum of about 750 nm to about 1100 nm and the other of the first wavelength ($\lambda_1$) and the second wavelength ($\lambda_2$) may be within a wavelength spectrum of about 800 nm to about 1500 nm.

The sensor 400 according to some example embodiments, including the example embodiments shown in FIG. 4, includes an optical filter 250; an upper infrared light sensor 100; an insulation layer 80; and a semiconductor substrate 40 in which a lower infrared light sensor 180 is integrated. The upper infrared light sensor 100 and the lower infrared light sensor 180 are stacked.

The optical filter 250 may be disposed at the front side of the sensor 400, selectively transmitting infrared light including the first wavelength ($\lambda_1$) and infrared light including the second wavelength ($\lambda_2$), and blocking and/or absorbing other light. Herein other light may also include light from ultraviolet (UV) and visible regions.

The upper infrared light sensor 100 may be the same as the infrared light sensor 100 of some example embodiments, including the example embodiments shown in any of FIGS. 1-3, and a detailed description thereof is omitted. In FIG. 4, an example including the infrared light sensor 100 of FIG. 1 is illustrated, but is not limited thereto. The infrared light sensor 100 of FIG. 2 may be also included.

The lower infrared light sensor 180 may be integrated in the semiconductor substrate 40 and may be a photodiode. The semiconductor substrate 40 may be for example a silicon substrate, in which a lower infrared light sensor 180, a charge storage 55, and a transmission transistor (not shown) are integrated.

The light that is flowed into the lower infrared light sensor 180 may be light passing through the optical filter 250 and the upper infrared light sensor 100, and may be infrared light in a particular (or, alternatively, predetermined) region including a second wavelength ($\lambda_2$). The infrared light of a particular (or, alternatively, predetermined) region including the first wavelength ($\lambda_1$) may be all substantially absorbed in the infrared photoelectric conversion layer 130 of the upper infrared light sensor 100 and not reach the lower infrared light sensor 180. Herein, a separate filter for wavelength selectivity of light flowing in the lower infrared light sensor 180 is not needed. However, when the infrared light of a particular (or, alternatively, predetermined) region including the first wavelength ($\lambda_1$) is not all absorbed in the infrared photoelectric conversion layer 130, a filter (not shown) between the upper infrared light sensor 100 and the lower infrared light sensor 180 may be additionally equipped.

The sensor according to some example embodiments, including the example embodiments shown in FIG. 4, may not only include two infrared light sensors performing separate functions and thus function as a composite sensor but also maintain a size by stacking the two sensors performing the separate functions in each pixel and greatly improve sensitivity by doubling the number of the pixel.

Figure 5:
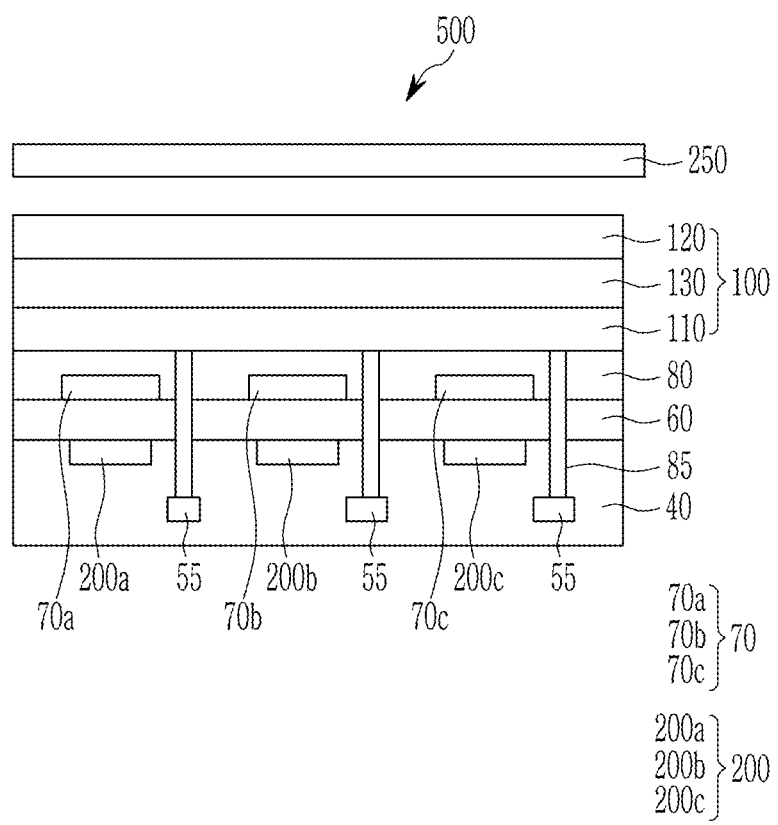
FIG. 5 is a cross-sectional view showing an example of a sensor according to some example embodiments.

FIG. 5 is a cross-sectional view showing an example of a sensor according to some example embodiments.

Referring to FIG. 5, the sensor 500 according to some example embodiments includes an infrared light sensor 100, a visible light sensor 200, and an optical filter 250.

The infrared light sensor 100 includes a first electrode 110, a second electrode 120, and an infrared photoelectric conversion layer 130 disposed between the first electrode 110 and the second electrode 120, as described above. Specific details thereof are the same as described above.

The visible light sensor 200 is a sensor configured to sense light in the visible wavelength spectrum and may be a photodiode integrated in the semiconductor substrate 40. The visible light sensor 200 may be integrated in the semiconductor substrate 40 and may include a blue sensor 200a configured to sense light in a blue wavelength spectrum, a green sensor 200b configured to sense light in a green wavelength spectrum, and a red sensor 200c configured to sense light in a red wavelength spectrum. As shown in FIG. 5, each of the blue sensor 200a, the green sensor 200b, and the red sensor 200c may be a photodiode that is integrated in the semiconductor substrate 40, such that the blue sensor 200a, the green sensor 200b, and the red sensor 200c are located within a volume space defined by outer surfaces of the semiconductor substrate 40 and may be partially or completely enclosed within an interior of the semiconductor substrate 40. The blue sensor 200a may be integrated in the blue pixel, the green sensor 200b may be integrated in the green pixel, and the red sensor 200c may be integrated in the red pixel. In the drawing, the blue sensor 200a, the green sensor 200b, and the red sensor 200c are for example shown to be disposed at the same depth from the surface of the semiconductor substrate 40, but are not limited thereto, and may be disposed at different depths.

The semiconductor substrate 40 may be for example a silicon substrate, and is integrated with a visible light sensor 200, a charge storage 55, and a transmission transistor (not shown). The visible light sensor 200 may sense light in a visible wavelength range passing through the optical filter 250, the infrared light sensor 100, and the color filter layer 70, and the sensed information may be transmitted by the transmission transistor. The charge storage 55 is electrically connected to the infrared light sensor 100.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), or alloys thereof, but is not limited thereto. However, it is not limited to the structure and the metal wire and pads may be disposed under the blue sensor 200a, the green sensor 200b, and the red sensor 200c.

The lower insulation layer 60 is formed on the semiconductor substrate 40. The lower insulation layer 60 may be made of an inorganic insulating material such as a silicon oxide and/or a silicon nitride, or a low dielectric constant (low K) material such as SiC, SiCOH, SiCO, and SiOF.

The color filter layer 70 is formed on the lower insulation layer 60. The color filter layer 70 may include a blue filter 70a configured to selectively transmit light in the blue wavelength spectrum, a green filter 70b configured to selectively transmit light in a green wavelength spectrum, and a red filter 70c configured to selectively transmit light in the red wavelength spectrum. The blue filter 70a, the green filter 70b, and the red filter 70c are each overlapped with the blue sensor 200a, the green sensor 200b, and the red sensor 200c in the depth direction (e.g., the z direction). The blue filter 70*a* may selectively transmit light in a blue wavelength spectrum, the green filter 70*b* may selectively transmit light in a green wavelength spectrum, and the red filter 70*c* may selectively transmit light in the red wavelength spectrum. The transmitted light of the blue wavelength spectrum may flow into the blue sensor 200*a*, the transmitted light of a green wavelength spectrum may flow into the green sensor 200*b*, and the transmitted light of the red wavelength spectrum may flow into the red sensor 200*c*. However, the present inventive concepts are not limited thereto, but at least one of the blue filter 70*a*, the green filter 70*b*, or the red filter 70*c* may be replaced with a yellow filter, a cyan filter, or a magenta filter. Herein, the color filter layer 70 is disposed between the infrared light sensor 100 and the visible light sensor 200 but not limited thereto and may be disposed on the infrared light sensor 100. For example, the upper insulation layer 80 and color filter layer 70 may be between the infrared light sensor 100 and the optical filter 250.

An upper insulation layer 80 (also referred to herein as an insulation layer 80) is formed on the color filter layer 70. The upper insulation layer 80 may be for example a planarization layer. The lower insulation layer 60 and the upper insulation layer 80 may have a trench 85 exposing the charge storage 55. The trench 85 may be filled with fillers. At least one of the lower insulation layer 60 or the upper insulation layer 80 may be omitted.

The optical filter 250 is disposed on the visible light sensor 200 and the infrared light sensor 100 and specifically, on the whole surfaces of the visible light sensor 200 and the infrared light sensor 100. The optical filter 250 may selectively transmit light of a wavelength sensed in the visible light sensor 200 and light of a wavelength sensed in the infrared light sensor 100 but reflect or absorb and thus block light of the other wavelengths.

Focusing lens (not shown) may be further formed on the upper or lower surface of the optical filter 250. The focusing lens may control a direction of incident light and gather the light in one region. The focusing lens may have a shape of, for example, a cylinder or a hemisphere, but is not limited thereto.

Figure 6:
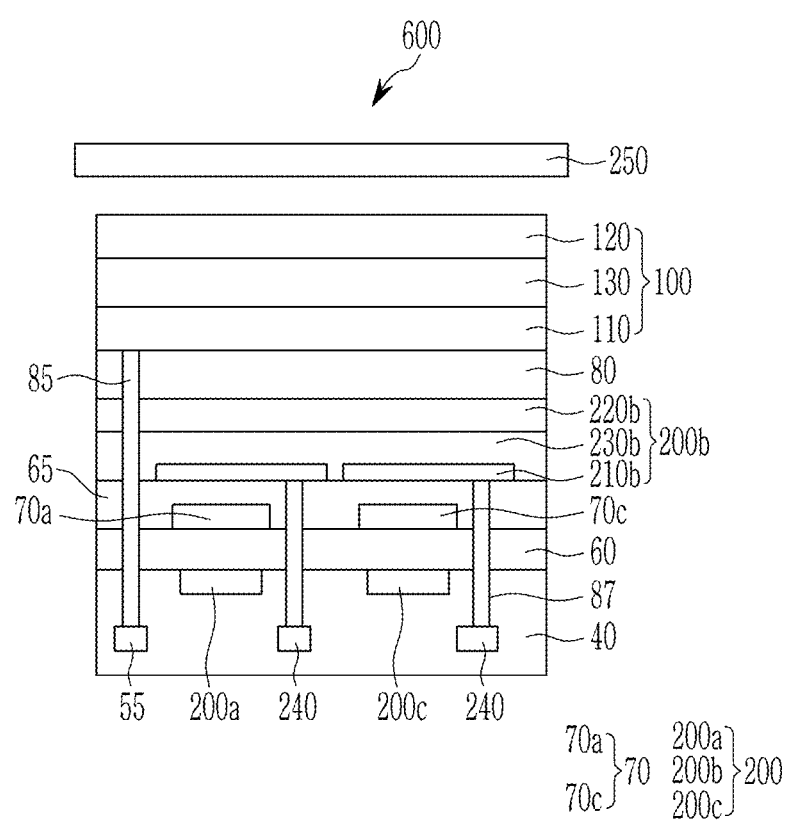
FIG. 6 is a cross-sectional view showing an example of a sensor according to some example embodiments.

FIG. 6 is a cross-sectional view showing an example of a sensor according to some example embodiments.

The sensor 600 according to some example embodiments, including the example embodiments shown in FIG. 6, includes an infrared light sensor 100, a visible light sensor 200, and an optical filter 250, like some example embodiments, including the example embodiments shown in any of FIGS. 4-5.

The infrared light sensor 100 includes a first electrode 110, a second electrode 120, and an infrared photoelectric conversion layer 130 between the first electrode 110 and the second electrode 120, and specific details thereof are the same as described above.

The visible light sensor 200 may be a combination of a photodiode integrated in the semiconductor substrate 40 and a photoelectric conversion device on the semiconductor substrate 40.

In the semiconductor substrate 40, a blue sensor 200*a*, a red sensor 200*c*, charge storages 55 and 240, and a transmission transistor (not shown) are integrated. The blue sensor 200*a* and the red sensor 200*c* are photodiodes and disposed apart from each other in a horizontal direction of the semiconductor substrate 40. The blue sensor 200*a* is integrated in a blue pixel, and the red sensor 200*c* is integrated in a red pixel. In the drawing, the blue sensor 200*a* and the red sensor 200*c* are for example shown to be disposed at the same depth from the surface of the semiconductor substrate 40, but are not limited thereto and may be disposed at different depths.

On the semiconductor substrate 40, a lower insulation layer 60 and a color filter layer 70 are formed. The color filter layer 70 includes a blue filter 70*a* overlapped with the blue sensor 200*a* and a red filter 70*c* overlapped with the red sensor 200*c*.

An intermediate insulation layer 65 is formed on the color filter layer 70. The lower insulation layer 60 and the intermediate insulation layer 65 may have trenches 85 and 87 exposing the charge storages 55 and 240. The trenches 85 and 87 may be filled with fillers. At least one of the lower insulation layer 60 or the intermediate insulation layer 65 may be omitted.

On the intermediate insulation layer 65, the green sensor 200*b* is formed. The green sensor 200*b* may be a photoelectric conversion device and disposed on the whole surface. The green sensor 200*b* includes a lower electrode 210*b* and an upper electrode 220*b* facing each other and a green photoelectric conversion layer 230*b* between disposed between the lower electrode 210*b* and the upper electrode 220*b*. Either one of the lower electrode 210*b* or the upper electrode 220*b* is an anode, while the other one is a cathode.

Both of the lower electrode 210*b* and the upper electrode 220*b* may be light-transmitting electrodes. The light-transmitting electrode may be for example made of a transparent conductor such as indium tin oxide (ITO), indium zinc oxide (IZO) or may be a metal thin film formed with a thin thickness of several nanometers to several tens of nanometer thickness or a single layer or multiple layers of metal thin film formed with a thin thickness of several nanometers to tens of nanometer thickness and doped with metal oxide.

The green photoelectric conversion layer 230*b* may selectively absorb light in a green wavelength spectrum and allow light from wavelength spectrums other than the green wavelength spectrum, that is, the blue wavelength spectrum and the red wavelength spectrum, to pass through. The green photoelectric conversion layer 230*b* may be formed on the whole surface of the sensor 600. As a result, the green photoelectric conversion layer 230*b* may be configured to selectively absorb light in a green wavelength spectrum from the whole surface of the sensor 600 and increase light absorption areas, thus having high absorption efficiency.

The green photoelectric conversion layer 230*b* may be configured to selectively absorb light of a green wavelength spectrum, forms excitons, and separates the excitons into holes and electrons, and as the separated holes move towards the anode which is one of the lower electrode 210*b* or the upper electrode 220*b*, while the separated electrons move toward the cathode which is the other one of the lower electrode 210*b* or the upper electrode 220*b*, a photoelectric conversion effect may be obtained. The separated electrons and/or holes may be gathered in charge storages 240.

An auxiliary layer (not shown) may be further included between the lower electrode 210*b* and the green photoelectric conversion layer 230*b* and/or between the upper electrode 220*b* and the green photoelectric conversion layer 230*b*. The auxiliary layer may be a charge auxiliary layer, a light absorbing auxiliary layer, or a combination thereof, but is not limited thereto.

Herein, an example structure in which the blue sensor 200*a* and the red sensor 200*c* are photodiodes and the green sensor 200*b* is a photoelectric conversion device is described, but is not limited thereto. The blue sensor 200*a* and the green sensor 200*b* may be photodiodes and the red sensor 200c may be a photoelectric conversion device or the green sensor 200b and the red sensor 200c may be photodiodes and the blue sensor 200a may be a photoelectric conversion device. Accordingly, two of the blue sensor 200a, the green sensor 200b, or the red sensor 200c may be integrated in the semiconductor substrate 40, and another of the blue sensor 200a, the green sensor 200b, or the red sensor 200c may be a visible light photoelectric conversion device on the semiconductor substrate 40 and stacked with the infrared light sensor 100 in a depth direction that is perpendicular to an in-plane direction of the infrared light sensor 100 (e.g., both the x and y directions) and/or is perpendicular to an upper surface of the semiconductor substrate 40 (e.g., the z direction).

On the green sensor 200b, an upper insulation layer 80 is formed, and on the upper insulation layer 80, the infrared light sensor 100 and the optical filter 250 are disposed. The infrared light sensor 100 and the optical filter 250 are the same as described above.

In FIG. 6, the color filter layer 70 and intermediate insulation layer 65 are between a photoelectric conversion device of the visible light sensor 200 (e.g., the green sensor 200b) and photodiodes of the visible light sensor 200 (e.g., the blue and red sensors 200a and 200c). However, example embodiments are not limited thereto. For example, in some example embodiments, the photoelectric conversion device of the visible light sensor 200 (e.g., the green sensor 200b) may be between the color filter layer 70 and photodiodes of the visible light sensor 200 (e.g., the blue and red sensors 200a and 200c) where the color filters of the color filter layer 70 are each configured to selectively transmit a mixture of the wavelength spectra absorbed by the photoelectric conversion device and a photodiode overlapped by the color filter. For example, sensors 200a-200c may be configured to sense separate ones of red-green-blue (RGB) colors, and color filters 70a, 70c may be configured to selectively transmit separate ones of cyan-magenta-yellow CMY colors. For example, when the green sensor 200b is between the color filter layer 70 and the blue and red sensors 200a and 200c, the blue filter 70a, which overlaps the blue sensor 200a in the depth direction, may be replaced with a cyan filter and the red filter 70c, which overlaps the red sensor 200c in the depth direction, is replaced with a yellow filter. The color filter layer 70, alone or together with the intermediate insulation layer 65, may be between the infrared light sensor 100 and the photoelectric conversion device (e.g., green sensor 200b) in the depth direction (e.g., in place of the insulation layer 80). The color filter layer 70, alone or together with the intermediate insulation layer 65, may be between the infrared light sensor 100 and the optical filter 250 in the depth direction.

The sensor 600 according to some example embodiments is a composite sensor equipped with the infrared light sensor 100 and the visible light sensor 200 stacked on each other, and the visible light sensor 200 also has a structure of stacking the photodiode and the photoelectric conversion device and thus may further reduce an area of the sensor and thus down-sized the sensor.

Figure 7:
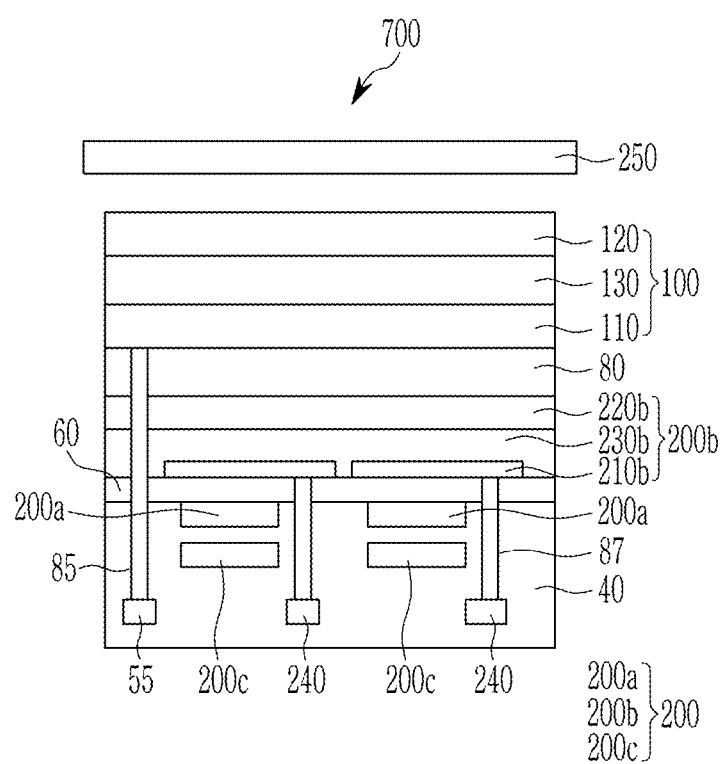
FIG. 7 is a cross-sectional view showing an example of a sensor according to some example embodiments.

FIG. 7 is a cross-sectional view showing an example of a sensor according to some example embodiments.

Referring to FIG. 7, the sensor 700 according to some example embodiments includes an infrared light sensor 100, a visible light sensor 200, and an optical filter 250, like some example embodiments, including the example embodiments shown in any of FIGS. 4-6.

The infrared light sensor 100 includes a first electrode 110, a second electrode 120, and an infrared photoelectric conversion layer 130 disposed between the first electrode 110 and the second electrode 120, and specific details thereof are the same as described above.

The visible light sensor 200 includes a blue sensor 200a and a red sensor 200c integrated in a semiconductor substrate 40 and a green sensor 200b disposed on the semiconductor substrate 40. The blue sensor 200a and red sensor 200c may be photodiodes and the green sensor 200b may be a photoelectric conversion device. The green sensor 200b includes a lower electrode 210b, a green photoelectric conversion layer 230b, and an upper electrode 220b.

However, in the sensor 700 according to some example embodiments, the blue sensor 200a and the red sensor 200c integrated in the semiconductor substrate 40 in a vertical direction are stacked. The blue sensor 200a and the red sensor 200c may selectively absorb and sense light of each wavelength spectrum depending on a stacking depth. In other words, the red sensor 200c absorbing red light of a long wavelength spectrum and the blue sensor 200a absorbing blue light of a short wavelength spectrum are disposed deep from the surface of the semiconductor substrate 40. In this way, the color filter layer 70 may be omitted by separating absorption wavelengths depending on a stacking depth.

Herein, an example structure in which the blue sensor 200a and the red sensor 200c are photodiodes and the green sensor 200b is a photoelectric conversion device is described, but is not limited thereto. The blue sensor 200a and the green sensor 200b may be photodiodes and the red sensor 200c may be a photoelectric conversion device or the green sensor 200b and the red sensor 200c may be photodiodes and the blue sensor 200a may be a photoelectric conversion device.

The sensor 700 according to some example embodiments is a composite sensor equipped with the infrared light sensor 100 and the visible light sensor 200 stacked each other, and herein, since the visible light sensor 200 also may be equipped with the photodiode and the photoelectric conversion device stacked each other, and the photodiode also has a stacking structure, an area of the sensor may be further reduced, and accordingly, the sensor may be down-sized. In addition, the sensor 700 according to some example embodiments may not include a separate color filter layer and thus simplify a structure and a process.

Figure 8:
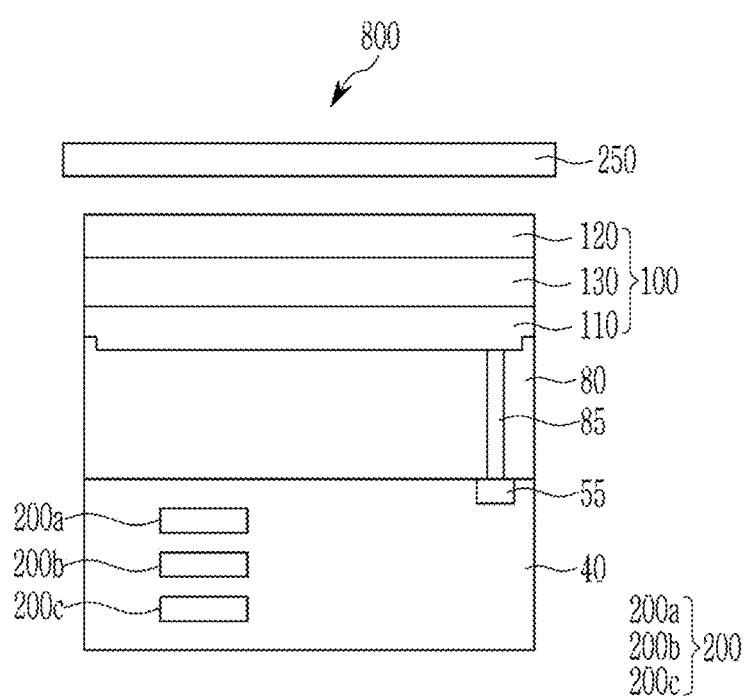
FIG. 8 is a cross-sectional view showing an example of a sensor according to some example embodiments.

FIG. 8 is a cross-sectional view showing an example of a sensor according to some example embodiments.

Referring to FIG. 8, the sensor 800 according to some example embodiments includes an infrared light sensor 100, a visible light sensor 200, and an optical filter 250, like some example embodiments, including the example embodiments shown in any of FIGS. 4-7.

The infrared light sensor 100 includes a first electrode 110, a second electrode 120, and an infrared photoelectric conversion layer 130 between the first electrode 110 and the second electrode 120, and specific details thereof are the same as described above.

The visible light sensor 200 includes a blue sensor 200a, a green sensor 200b, and a red sensor 200c integrated in a semiconductor substrate 40. The blue sensor 200a, the green sensor 200b, and the red sensor 200c are stacked in a vertical direction in the semiconductor substrate 40. The blue sensor 200a, the green sensor 200b, and the red sensor 200c may separate an absorption wavelength according to a stacking depth, and thus the color filter layer 70 may be omitted. An insulation layer 80 is formed between the semiconductor substrate 40 and the infrared light sensor 100 and the insulation layer 80 has a trench 85. The semiconductor substrate 40 includes a charge storage 55 that is connected to the infrared light sensor 100.

Figure 9:
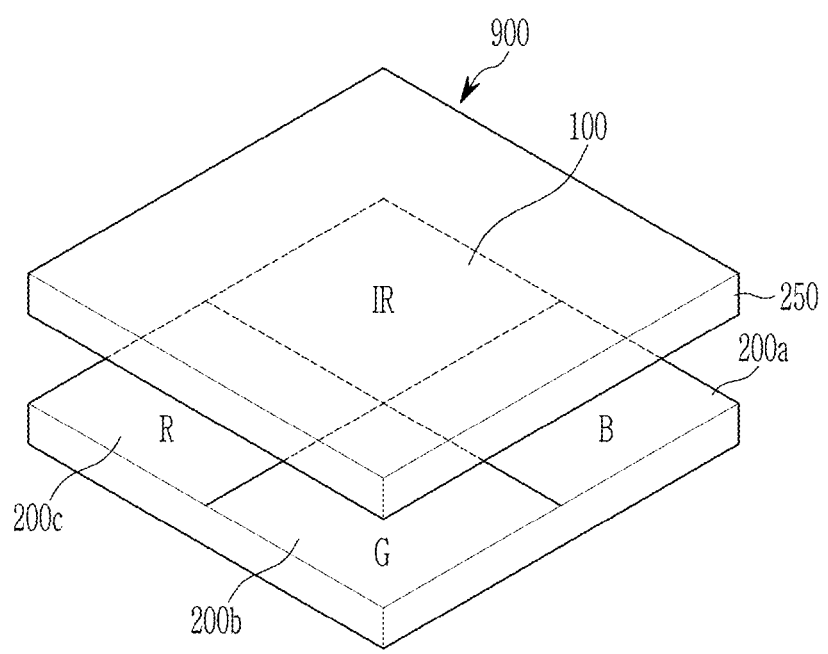
FIG. 9 is a perspective view showing an example of a sensor according to some example embodiments.
Figure 10:
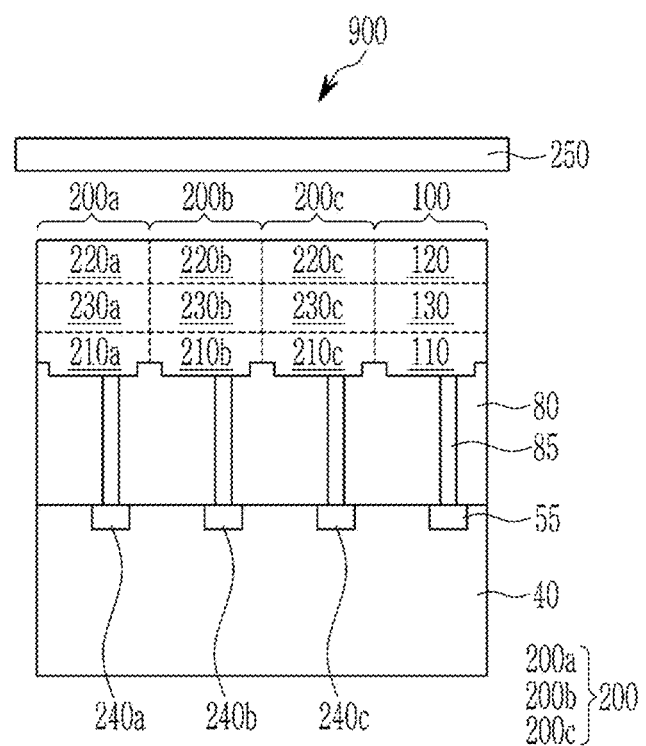
FIG. 10 is a cross-sectional view showing an example of the sensor of FIG. 9.

FIG. 9 is a perspective view showing an example of a sensor according to some example embodiments, and FIG. 10 is a cross-sectional view showing an example of the sensor shown in FIG. 9.

Referring to FIGS. 9 and 10, the sensor 900 according to some example embodiments includes a semiconductor substrate 40; an infrared light sensor 100; a visible light sensor 200; an insulation layer 80; and an optical filter 250. The visible light sensor 200 includes a blue sensor 200*a*, a green sensor 200*b*, and a red sensor 200*c*.

The infrared light sensor 100, the blue sensor 200*a*, the green sensor 200*b*, and the red sensor 200*c* may be stacked in a horizontal direction on the semiconductor substrate 40, and may be each connected, via respective trenches 85, to the charge storages 55, 240*a*, 240*b*, and 240*c* integrated in the semiconductor substrate 40.

The infrared light sensor 100, the blue sensor 200*a*, the green sensor 200*b*, and the red sensor 200*c* are each photoelectric conversion device.

The infrared light sensor 100 includes a first electrode 110, a second electrode 120, and an infrared photoelectric conversion layer 130 disposed between the first electrode 110 and the second electrode 120, and specific details thereof are the same as described above.

The blue sensor 200*a* includes a lower electrode 210*a*, a blue photoelectric conversion layer 230*a*, and an upper electrode 220*a*. The green sensor 200*b* includes a lower electrode 210*b*, a green photoelectric conversion layer 230*b*, and an upper electrode 220*b*. The red sensor 200*c* includes a lower electrode 210*c*, a red photoelectric conversion layer 230*c*, and an upper electrode 220*c*. The blue photoelectric conversion layer 230*a* may selectively absorb light in a blue wavelength spectrum to perform photoelectric conversion, the green photoelectric conversion layer 230*b* may selectively absorb light in a green wavelength spectrum to perform photoelectric conversion, and the red photoelectric conversion layer 230*c* may selectively absorb light in a red wavelength spectrum to perform photoelectric conversion.

Figure 11:
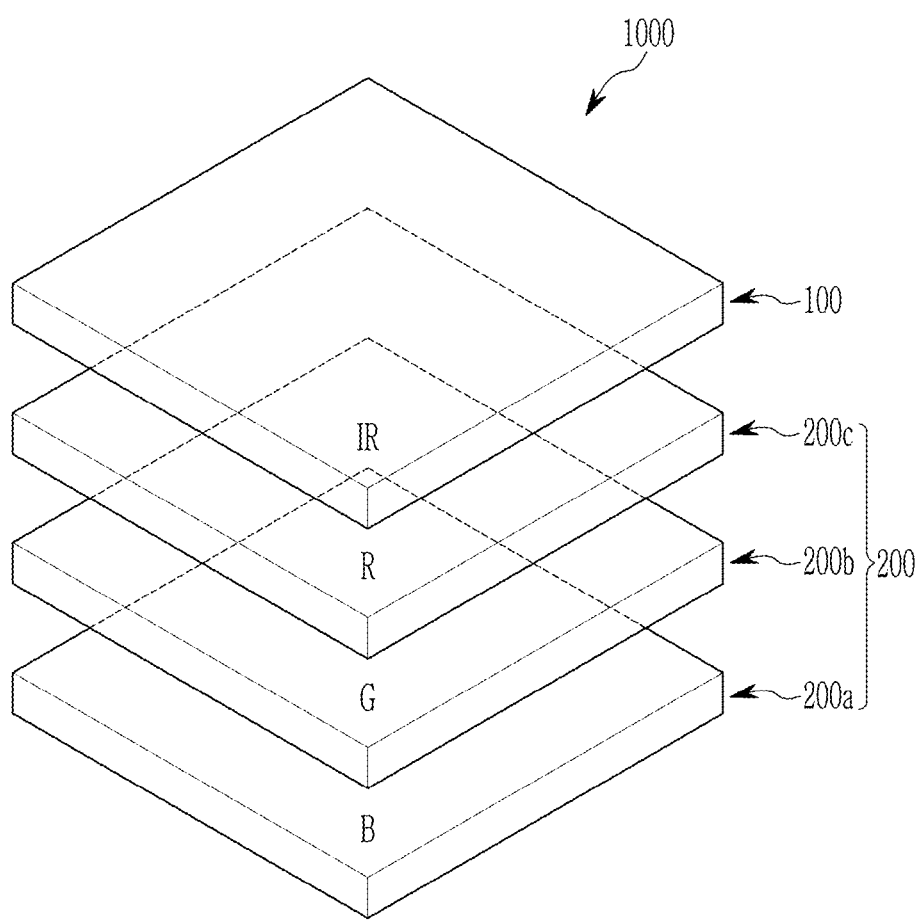
FIG. 11 is a perspective view showing an example of a sensor according to some example embodiments.
Figure 12:
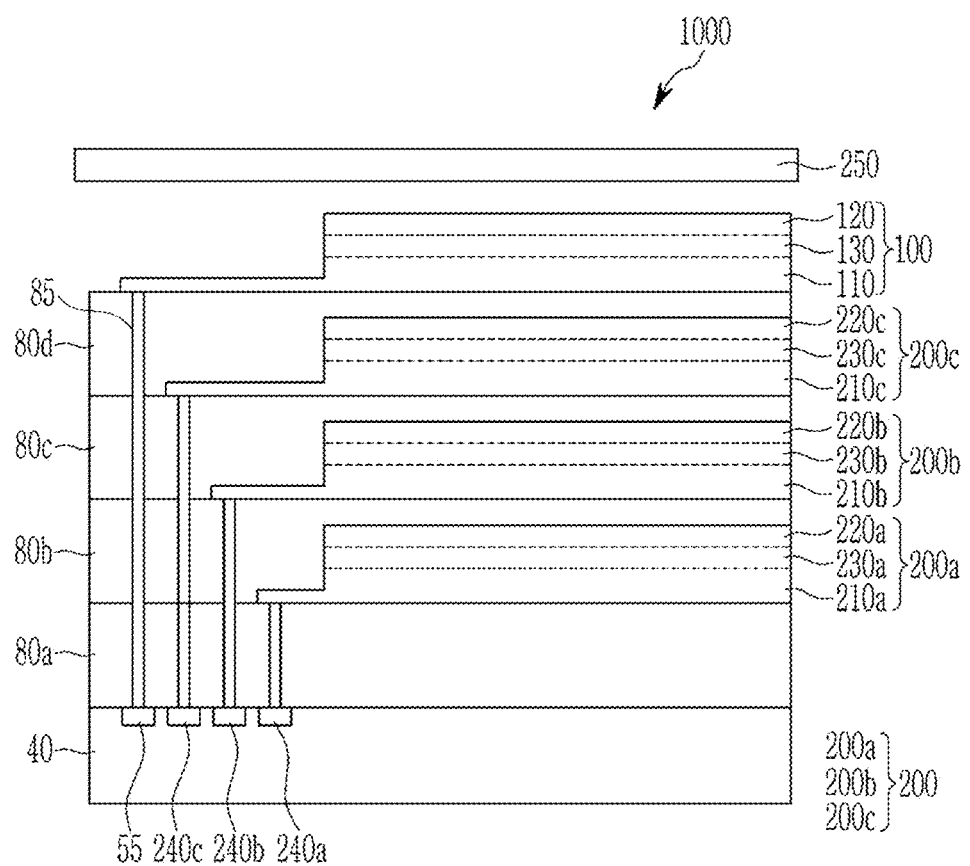
FIG. 12 is a cross-sectional view showing an example of the sensor of FIG. 11.

FIG. 11 is a perspective view showing an example of a sensor according to some example embodiments, and FIG. 12 is a cross-sectional view showing an example of the sensor shown in FIG. 11.

Referring to FIGS. 11 and 12, a sensor 1000 according to some example embodiments includes a semiconductor substrate 40; an infrared light sensor 100; a visible light sensor 200; and an optical filter 250. The visible light sensor 200 includes a blue sensor 200*a*, a green sensor 200*b*, and a red sensor 200*c*.

The infrared light sensor 100, the blue sensor 200*a*, the green sensor 200*b*, and the red sensor 200*c* may be stacked in a vertical direction on the semiconductor substrate 40, and may be each connected, via respective trenches 85, to charge storages 55, 240*a*, 240*b*, and 240*c* integrated in the semiconductor substrate 40.

The infrared light sensor 100 includes a first electrode 110, a second electrode 120, and an infrared photoelectric conversion layer 130 disposed between the first electrode 110 and the second electrode 120, and specific details thereof are the same as described above.

The blue sensor 200*a* includes a lower electrode 210*a*, a blue photoelectric conversion layer 230*a*, and an upper electrode 220*a*. The green sensor 200*b* includes a lower electrode 210*b*, a green photoelectric conversion layer 230*b*, and an upper electrode 220*b*. The red sensor 200*c* includes a lower electrode 210*c*, a red photoelectric conversion layer 230*c*, and an upper electrode 220*c*.

Insulation layers 80*a*, 80*b*, 80*c*, and 80*d* are respectively disposed between the semiconductor substrate 40 and the blue sensor 200*a*, between the blue sensor 200*a* and the green sensor 200*b*, between the green sensor 200*b* and the red sensor 200*c*, and between the red sensor 200*c* and the infrared light sensor 100.

In some example embodiments, a structure of sequentially stacking the infrared light sensor 100, the blue sensor 200*a*, the green sensor 200*b*, and the red sensor 200*c* are illustrated but the present inventive concepts are not limited thereto, and the present inventive concepts may have unlimitedly various stacking orders. Accordingly, each of the blue sensor 200*a*, the green sensor 200*b*, and the red sensor 200*c* may be a visible light photoelectric conversion device that is stacked with the infrared light sensor 100 in a depth direction that is perpendicular to an in-plane direction of the infrared light sensor 100 (e.g., both the x and y directions) and/or is perpendicular to an upper surface of the semiconductor substrate 40 (e.g., the z direction).

Referring generally to FIGS. 5-12, a sensor may include an infrared light sensor 100, a visible light sensor 200, and a semiconductor substrate 40. As shown in at least FIGS. 10-11, the infrared light sensor 100 may be arranged in parallel with the visible light sensor 200 along an in-plane direction (e.g., the xy plane) in which both the infrared light sensor 100 and the visible light sensor 200 extend. As shown in at least FIGS. 5-8 and FIGS. 11-12, the infrared light sensor 100 may be stacked with the visible light sensor 200 along a depth direction of the semiconductor substrate 40. The depth direction may be understood to be perpendicular to an upper surface of the semiconductor substrate 40. The depth direction may be understood to be perpendicular to the in-plane direction(s) in which the infrared light sensor 100 extends, for example the x and y directions.

The aforementioned sensor may be applied to (e.g., included in) various electronic devices, for example mobile phones, digital cameras, computers, tablet PC, biometric devices, and/or automotive electronic components, but the present inventive concepts are not limited thereto.

Figure 13:
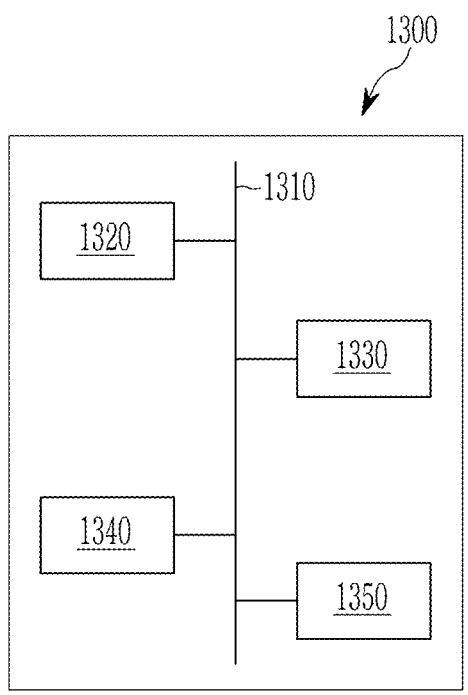
FIG. 13 is a schematic diagram of an electronic device according to some example embodiments.

FIG. 13 is a schematic diagram of an electronic device according to some example embodiments.

Referring to FIG. 13, an electronic device 1300 includes a processor 1320, a memory 1330, a sensor 1340, and a display device 1350 (e.g., an OLED display screen device) electrically connected through a bus 1310. The sensor 1340 may be any of the aforementioned various sensors 100, 300, 400, 500, 600, 700, 800, 900, and/or 1000. The processor 1320 may perform a memory program and thus at least one function. The processor 1320 may additionally perform a memory program and thus display an image on the display device 1350. The processor 1320 may generate an output.

One or more of the processor 1320, memory 1330, sensor 1340, or display device 1350 may be included in, include, and/or implement one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the electronic device 1300, processor 1320, memory 1330, sensor 1340, display device 1350, or the like according to any of the example embodiments as described herein.

Hereinafter, some example embodiments are illustrated in more detail with reference to examples. However, the following examples are for illustrative purposes and do not limit the scope of the rights.

EXAMPLES

Example 1-1

A compound represented by Chemical Formula C-1 (HOMO: 5.08 eV, LUMO: 1.98 eV) is deposited on an Ag reflector (Work function: 4.7 eV) to form a 20 nm-thick lower auxiliary layer. Subsequently, on the lower auxiliary layer, Sn-naphthalocyanine dichloride represented by Chemical Formula A (first material, p-type semiconductor, $\lambda_{max,A}$: 870 nm, HOMO: 5.16 eV, LUMO: 3.96 eV), C60 represented by Chemical Formula B (second material, n-type semiconductor, $\lambda_{max,A}$: 450 nm, HOMO: 6.0 eV, LUMO: 4.3 eV), and a compound represented by Chemical Formula C-1 (third material, HOMO: 5.08 eV, LUMO: 1.98 eV) are co-deposited in a thickness ratio (a volume ratio) of 40:150:20 to form a 210 nm-thick infrared photoelectric conversion layer. On the infrared photoelectric conversion layer, C60 is deposited to form a 15 nm-thick upper auxiliary layer, and silver (Ag) is deposited on the upper auxiliary layer to form a 30 nm-thick upper electrode, manufacturing an infrared sensor.

[Chemical Formula A]

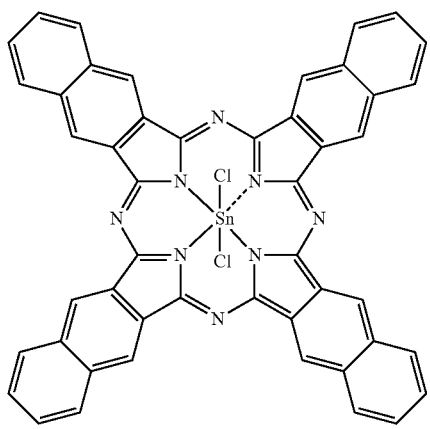

[Chemical Formula B]

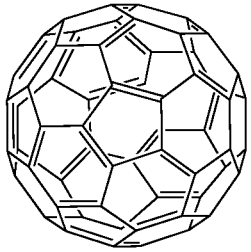

[Chemical Formula C-1]

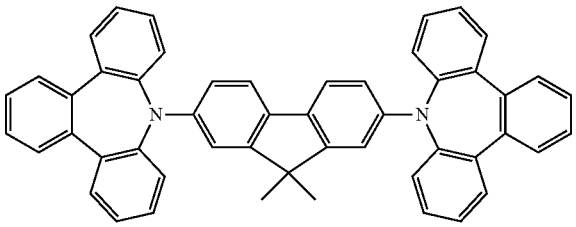

Example 1-2

An infrared sensor is manufactured according to the same method as Example 1-1 except that the first material, the second material, and the third material are co-deposited in a thickness ratio (volume ratio) of 40:150:40 to form a 230 nm-thick infrared photoelectric conversion layer.

Example 1-3

An infrared sensor is manufactured according to the same method as Example 1-1 except that the first material, the second material, and the third material are co-deposited in a thickness ratio (volume ratio) of 40:150:60 to form a 250 nm-thick infrared photoelectric conversion layer.

Example 2

An infrared sensor is manufactured according to the same method as Example 1-1 except that a compound represented by Chemical Formula C-2 (HOMO: 5.14 eV, LUMO: 2.04 eV) instead of the compound represented by Chemical Formula C-1 is used as the third material, and the first material, the second material, and the third material are co-deposited in a thickness ratio (a volume ratio) of 40:150:40 to form a 230 nm-thick infrared photoelectric conversion layer.

[Chemical Formula C-2]

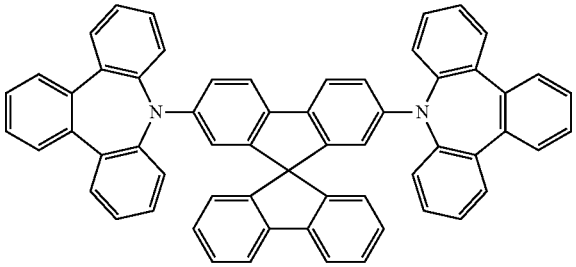

Example 3

An infrared sensor is manufactured according to the same method as Example 1-1 except that a compound represented by Chemical Formula C-3 (HOMO: 5.29 eV, LUMO: 2.29 eV) instead of the compound represented by Chemical Formula C-1 is used as the third material, and the first material, the second material, and the third material are co-deposited in a thickness ratio (a volume ratio) of 45:140:35 to form a 220 nm-thick infrared photoelectric conversion layer.

[Chemical Formula C-3]

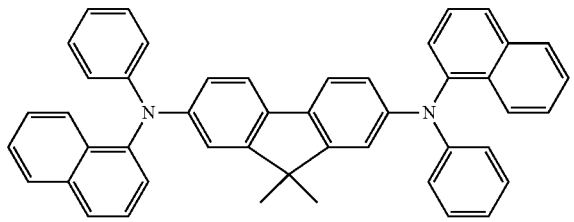

Example 4

An infrared sensor is manufactured according to the same method as Example 1-1 except that a compound represented by Chemical Formula C-4 (HOMO: 4.96 eV, LUMO: 1.80 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-4]

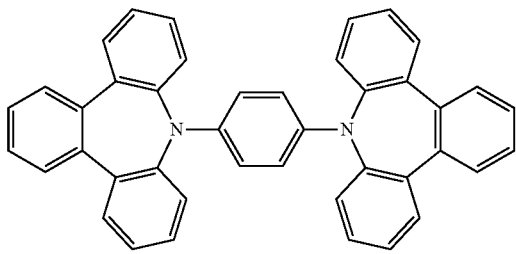

Example 5

An infrared sensor is manufactured according to the same method as Example 1-1 except that a compound represented by Chemical Formula C-5 (HOMO: 5.25 eV, LUMO: 2.01 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-5]

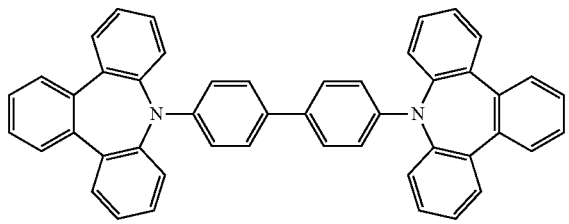

Example 6

An infrared sensor is manufactured according to the same method as Example 1-1 except that a compound represented by Chemical Formula C-6 (HOMO: 5.73 eV, LUMO: 2.54 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-6]

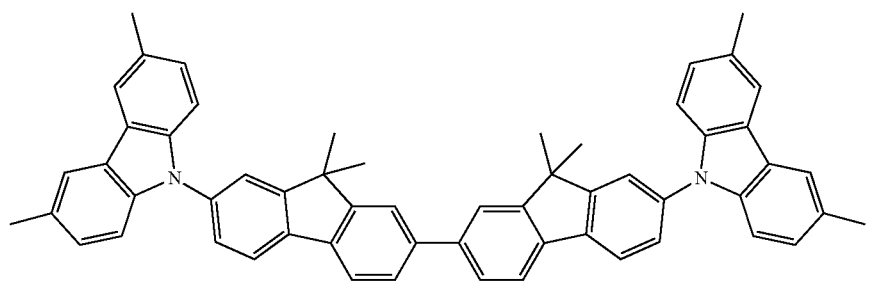

Example 7

An infrared sensor is manufactured according to the same method as Example 1-1 except that a compound represented by Chemical Formula C-7 (HOMO: 5.41 eV, LUMO: 2.49 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-7]

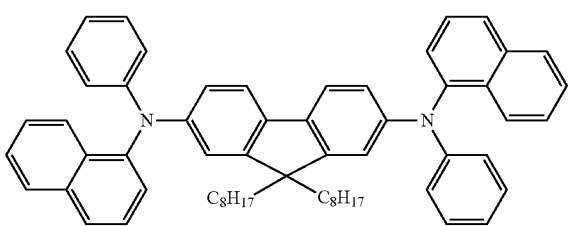

Example 8

An infrared sensor is manufactured according to the same method as Example 1-1 except that a compound represented by Chemical Formula C-8 (HOMO: 5.36 eV, LUMO: 2.32 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-8]

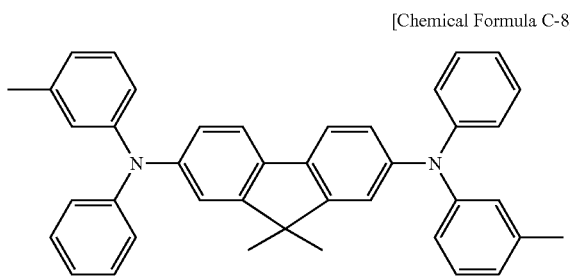

Example 9

An infrared sensor is manufactured according to the same method as Example 1-1 except that a compound represented by Chemical Formula C-9 (HOMO: 6.00 eV, LUMO: 2.67 eV) instead of the compound represented by Chemical Formula C-1 is used as the third material, and the first material, the second material, and the third material are co-deposited in a thickness ratio (a volume ratio) of 45:140:30 to form a 215 nm-thick infrared photoelectric conversion layer.

[Chemical Formula C-9]

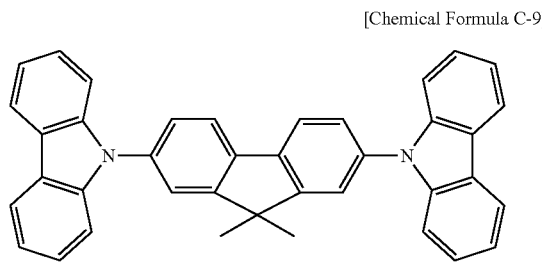 [SMILES: CC1(C)c2cc(-n3c4ccccc4c4ccccc43)ccc2-c2ccc(-n3c4ccccc4c4ccccc43)cc21]

Comparative Example 1

An infrared sensor is manufactured according to the same method as Example 1-1 except that the first material and the second material are co-deposited in a thickness ratio (volume ratio) of 40:150 without the third material to form a 190 nm-thick infrared photoelectric conversion layer.

Evaluation I

Absorption spectra and EQE spectra of the infrared sensors according to Examples and Comparative Example 1 are evaluated.

The absorption spectra and EQE spectra of the infrared sensors, which may be the absorption spectra and EQE spectra of the respective infrared photoelectric conversion layers contained therein, are respectively evaluated by using an UV-Visible spectrophotometer and an Incident Photon to Current Conversion Efficiency (IPCE) equipment.

The results are shown in Table 1.

TABLE 1

|  | $\lambda_{max, A}$ (nm) | $\lambda_{max, EQE}$ (nm) |
|---|---|---|
| Example 1-1 | 1150 | 1150 |
| Example 1-2 | 1250 | 1250 |
| Example 1-3 | 1270 | 1270 |
| Example 2 | 1230 | 1230 |
| Example 3 | 1200 | 1200 |
| Example 4 | 1195 | 1195 |
| Example 5 | 1195 | 1195 |
| Example 6 | 1185 | 1185 |
| Example 7 | 1200 | 1200 |
| Example 8 | 1200 | 1200 |
| Example 9 | 1190 | 1190 |
| Comparative Example 1 | 1110 | 1110 |

* $\lambda_{max, A}$: maximum absorption wavelength
* $\lambda_{max, EQE}$: maximum EQE wavelength Referring to Table 1, the absorption spectra (maximum absorption wavelength) and EQE spectra (maximum EQE wavelength) of the infrared sensors according to Examples are shifted toward a long wavelength spectrum, compared with the infrared sensors according to Comparative Example. In addition, as the content of the third material in the infrared photoelectric conversion layer increases, the absorption spectrum (maximum absorption wavelength) and the EQE spectrum (maximum EQE wavelength) of the Examples are further shifted toward the longer wavelength spectrum in relation to that of the Comparative Example 1.

Evaluation II

In the infrared sensors according to the Examples and Comparative Example 1, a change of the number of charge trap sites and a dark current under a reverse bias voltage depending on a content of the third material are examined.

The number of charge trap sites is converted from Capacitance-Voltage characteristics measured by using an Impedance analyzer.

The dark current is evaluated by using dark current density, which is obtained by measuring the dark current with a current-voltage evaluation equipment (Keithley K4200 parameter analyzer, Keithley Instrument, LLC) and dividing it with a unit pixel area (0.04 cm²). The dark current density is evaluated from a current flowing when −3 V reverse bias is applied.

The results are shown in Table 2.

TABLE 2

|  | Number of charge trap sites ($10^{16}$ cm$^{-3}$ev$^{-1}$) | Dark current density (h/s/μm²) |
|---|---|---|
| Example 1-1 | 31 | $1.2 \times 10^5$ |
| Example 1-2 | 5.6 | $5.2 \times 10^4$ |
| Example 1-3 | 6.2 | $4.4 \times 10^4$ |
| Example 2 | 47 | $1.5 \times 10^5$ |
| Example 3 | 49 | $7.7 \times 10^4$ |
| Example 4 | — | $9.7 \times 10^4$ |
| Example 5 | — | $9.3 \times 10^4$ |
| Example 6 | — | $8.3 \times 10^4$ |
| Example 7 | — | $1.2 \times 10^5$ |
| Example 8 | — | $1.2 \times 10^5$ |
| Comparative Example 1 | 466 | $3.3 \times 10^5$ |

Referring to Table 2, the infrared sensors according to the Examples exhibit the smaller number of charge trap sites and lower dark current density, compared with the infrared sensors according to Comparative Example 1. In addition, when the third material is included in a larger amount in the infrared photoelectric conversion layer, the number of the charge trap sites and the dark current density become much smaller.

While this inventive concepts have been described in connection with what is presently considered to be practical example embodiments, it is to be understood that the inventive concepts are not limited to the described example embodiments, but, on the contrary, the inventive concepts are intended to cover various modifications and equivalent arrangements included within the spirit and scope of the appended claims.

What is claimed is:

1. A sensor, comprising:
   a first electrode and a second electrode; and
   an infrared photoelectric conversion layer between the first electrode and the second electrode, the infrared photoelectric conversion layer being configured to absorb light in at least a portion of an infrared wavelength spectrum and convert the absorbed light into an electrical signal,
   wherein the infrared photoelectric conversion layer includes
      a first material having a maximum absorption wavelength in the infrared wavelength spectrum,
      a second material forming a pn junction with the first material, and a third
      material having an energy band gap greater than an energy band gap of the first material by greater than or equal to about 1.0 eV, wherein the first material, the second material, and the third material are different from each other,
   wherein each of the first material, the second material, and the third material is a non-polymeric material, and
   wherein the infrared photoelectric conversion layer includes a mixture of the first material, the second material, and the third material, n
   wherein the third material is an organic material.

2. The sensor of claim 1, wherein a difference between a HOMO energy level of the first material and a HOMO energy level of the third material is less than about 1.0 eV.

3. The sensor of claim 1, wherein a difference between a HOMO energy level of the second material and a HOMO energy level of the first material is greater than or equal to about 0.5 eV.

4. The sensor of claim 1, wherein
   the energy band gap of the first material is about 0.5 eV to about 1.8 eV, and the energy
   band gap of the third material is about 2.8 eV to about 4.0 eV.

5. The sensor of claim 1, wherein the energy band gap of the third material is greater than an energy band gap of the second material.

6. The sensor of claim 1, wherein the first material is included in the infrared photoelectric conversion layer in a smaller amount than the second material.

7. The sensor of claim 6, wherein a composition ratio of the first material to the second material in the infrared photoelectric conversion layer is about 0.10 to about 0.90.

8. The sensor of claim 7, wherein the composition ratio of the first material to the second material in the infrared photoelectric conversion layer is about 0.10 to about 0.50.

9. The sensor of claim 1, wherein each of the first material and the third material is included in the infrared photoelectric conversion layer in a smaller amount than the second material.

10. The sensor of claim 1, wherein the third material is included in the infrared photoelectric conversion layer in an amount of about 1 volume % to about 40 volume % based on a total volume of the infrared photoelectric conversion layer.

11. The sensor of claim 10, wherein the third material is included in the infrared photoelectric conversion layer in an amount of about 7 volume % to about 25 volume % based on the total volume of the infrared photoelectric conversion layer.

12. The sensor of claim 1, wherein a maximum absorption wavelength of the infrared photoelectric conversion layer is longer than the maximum absorption wavelength of the first material.

13. The sensor of claim 1, wherein a maximum absorption wavelength or a maximum external quantum efficiency wavelength of the sensor is shifted toward a longer wavelength as a content of the third material in the infrared photoelectric conversion layer increases.

14. The sensor of claim 1, wherein the third material is represented by Chemical Formula 1:

[Chemical Formula 1]

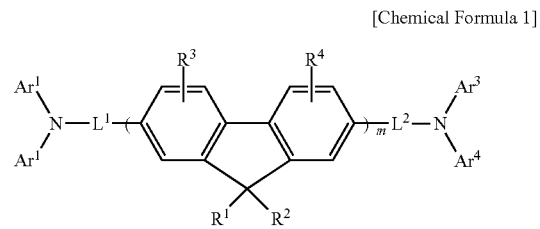

wherein, in Chemical Formula 1, $L^1$ and $L^2$ are independently a single bond, a substituted or unsubstituted C1 to C30 alkylene group, a substituted or unsubstituted C6 to C30 arylene group, or a combination thereof, $Ar^1$ to $Ar^4$ are independently a substituted or unsubstituted C6 to C30 aryl group, $Ar^1$ and $Ar^2$ are independently present or are combined with each other to form a ring, $Ar^3$ and $Ar^4$ are independently present or are combined with each other to form a ring, $R^1$ to $R^4$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, halogen, cyano group, or a combination thereof, $R^1$ to $R^4$ are independently present or two of $R^1$ to $R^4$ that are adjacent to each other are combined to form a ring, and m is an integer of 0 to 2.

15. The sensor of claim 14, wherein the third material is represented by one of Chemical Formulas 1-1 to 1-8:

[Chemical Formula 1-1]
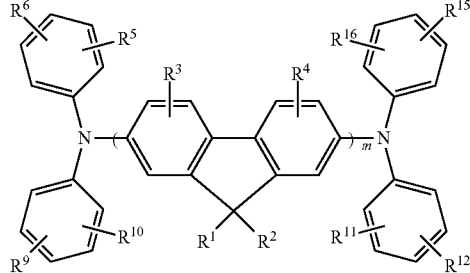

[Chemical Formula 1-2]
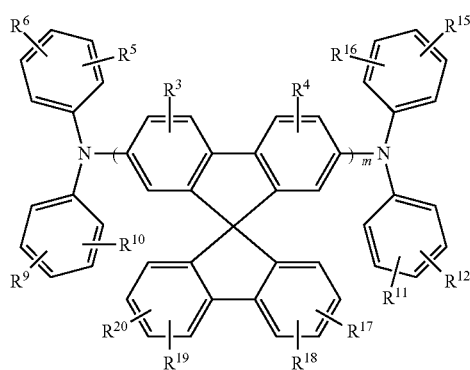

[Chemical Formula 1-3]
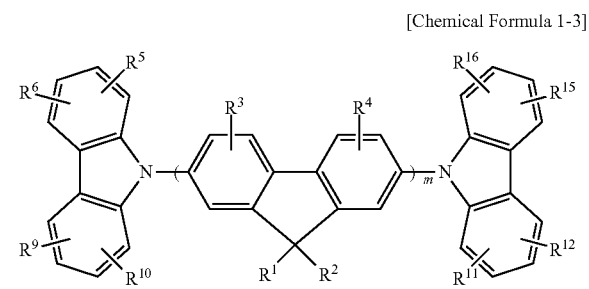

[Chemical Formula 1-4]
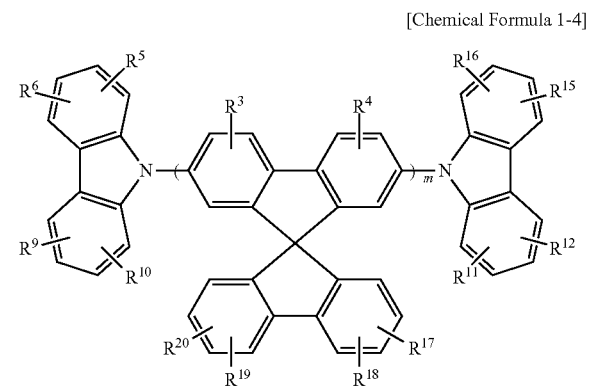

[Chemical Formula 1-5]
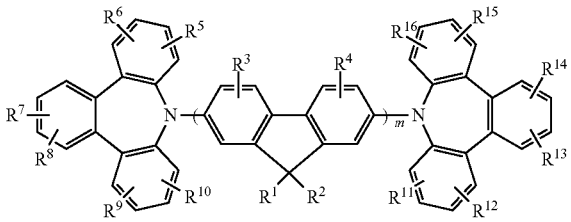

[Chemical Formula 1-6]
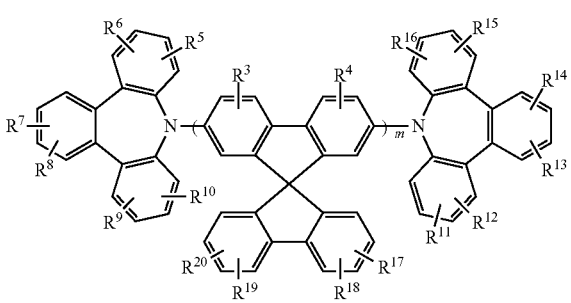

[Chemical Formula 1-7]
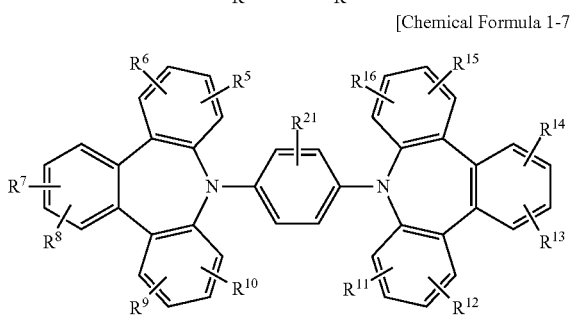

[Chemical Formula 1-8]
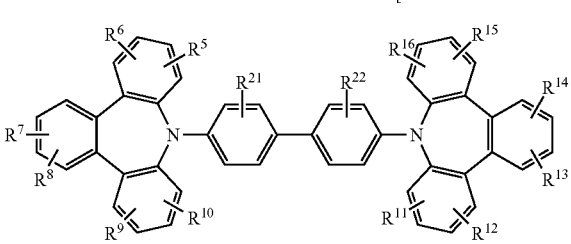

wherein, in Chemical Formulas 1-1 to 1-8, $R^1$ to $R^{22}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted amine group, a substituted or unsubstituted C6 to C30 arylamine group, halogen, cyano group, or a combination thereof, $R^1$ to $R^{22}$ are independently present or two of $R^1$ to $R^{22}$ that are adjacent to each other are combined to form a ring, and m is 1 or 2.

16. The sensor of claim 1, wherein the infrared photoelectric conversion layer is a ternary system of the first material, the second material, and the third material.

17. The sensor of claim 1, wherein the sensor has a maximum external quantum efficiency wavelength that is in a range of about 800 nm to about 1500 nm.

18. The sensor of claim 1, further comprising:
a first auxiliary layer between the first electrode and the infrared photoelectric conversion layer, and
a second auxiliary layer between the second electrode and the infrared photoelectric conversion layer,
wherein at least one of the first auxiliary layer or the second auxiliary layer comprises a fourth material, the fourth material being a same material as the third material or different from the third material,
wherein an energy band gap of the fourth material is greater than the energy band gap of the first material by greater than or equal to about 1.0 eV, and
wherein a HOMO energy level of the fourth material is between a work function of the first electrode and a HOMO energy level of the first material.

19. An electronic device comprising the sensor of claim 1.

20. The sensor of claim 1, further comprising:
a first auxiliary layer between the first electrode and the infrared photoelectric conversion layer,
wherein the first auxiliary layer comprises the third material,
wherein a HOMO energy level of the third material is between a work function of the first electrode and a HOMO energy level of the first material.

* * * * *